(12) United States Patent
Ugajin

(10) Patent No.: US 6,952,019 B2
(45) Date of Patent: Oct. 4, 2005

(54) ELECTRON DEVICE WHICH CONTROLS QUANTUM CHAOS AND QUANTUM CHAOS CONTROLLING METHOD

(75) Inventor: Ryuichi Ugajin, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/781,283

(22) Filed: Feb. 18, 2004

(65) Prior Publication Data

US 2004/0201010 A1 Oct. 14, 2004

(30) Foreign Application Priority Data

Feb. 26, 2003 (JP) ..................... P2003-048863
May 20, 2003 (JP) ..................... P2003-141659
Jul. 25, 2003 (JP) ..................... P2003-279956

(51) Int. Cl.[7] ......................................... H01L 31/072
(52) U.S. Cl. ........................ 257/25; 257/12; 257/14
(58) Field of Search ....................... 257/25, 12–27; 438/22, 48, 590

(56) References Cited

U.S. PATENT DOCUMENTS 5,105,232 A * 4/1992 del Alamo et al. ........... 257/24

FOREIGN PATENT DOCUMENTS

JP 61296765 A * 12/1986 ........... H01L/29/68

* cited by examiner

Primary Examiner—Nathan J. Flynn
Assistant Examiner—Scott R. Wilson
(74) Attorney, Agent, or Firm—Sonnenschein Nath & Rosenthal LLP

(57) ABSTRACT

An electron device which controls quantum chaos wherein a quantum chaos property is controlled extensively and externally is provided. The electron device which controls quantum chaos is manufactured by using a single material. A heterojunction provided with a first region having an electron system characterized by quantum chaos and a second region having an electron system characterized by integrability is formed. The first region and the second region are adjacent to each other, and the heterojunction is capable of exchanging electrons between the first region and the second region. A quantum chaos property of an electron system in a system formed of the first region and the second region is controlled by applying to the heterojunction an electric field having a component perpendicular to at least a junction surface.

2 Claims, 20 Drawing Sheets

ELECTRON DEVICE WHICH CONTROLS QUANTUM CHAOS AND QUANTUM CHAOS CONTROLLING METHOD

RELATED APPLICATION DATA

The present application claims priority to Japanese Application(s) No(s). P2003-048863 filed Feb. 26, 2003, P2003-14 1659 filed May 20, 2003, and P2003-279956 filed Jul. 25, 2003, which application(s) is/are incorporated herein by reference to the extent permitted by law.

BACKGROUND OF THE INVENTION

1. Field of the Invention

The present invention relates to an electron device which controls quantum chaos and a method of controlling quantum chaos, and, particularly, the invention is based on a novel principle.

2. Description of the Related Art

Intrinsic nonlinearity is important as a physical system in the field of information processing. Electronic elements made from materials having a certain nonlinear response have heretofore been used. An example of the electronic elements having nonlinear current/voltage characteristics is a two-terminal element having a differential negative resistance. Of course, MOS-FETs support the modern technology as a three-terminal element. These nonlinear electronic elements are bonded in a linear electronic circuit to construct a nonlinear information processor for executing an arbitrary calculation.

However, problems caused by the high integration have been detected with such electronic circuit. For example, a heating problem has been raised. The heating caused by an intrinsic electric resistance is mandatory for generating the nonlinearity of the electronic element as well as is necessary and essential for executing information processing.

In order to avoid the problem, attempts of reducing the number of elements by increasing the nonlinearity of each of the component elements have been made. In the course of the attempts, a component element having a so strong nonlinearity that exhibits chaos has inevitably been desired. In the case of quantizing a classical system exhibiting chaos, a behavior of the quantum system is characterized by quantum chaos.

In turn, in the fine component element, electrons trapped in the element behave as quantum-mechanic particles. From this standpoint, therefore, the component element showing the quantum chaos is attracting attention.

The inventor of this invention has theoretically clarified that a change in a structure of a material contributes to a control on quantum chaos in an electronic system of the structure. Examples of possible control are a control achieved by adjusting an effective size of interaction between electrons through a change in size of a quantum dot (Non-Patent Literature 1), a control achieved by controlling a fractal dimension in a fractal aggregate (Non-Patent Literatures 2, 3, and 4), a structure control in a multiplexed hierarchical structure (Non-Patent Literature 5), and the like.

Non-Patent Literature 1: R. Ugajin, Physica A 237, 220 (1997)

Non-Patent Literature 2: R. Ugajin, S. Hirata, and Y. Kuroki, Physica A 278, 312 (2000)

Non-Patent Literature 3: R. Ugajin, Phys. Lett. A 277, 267 (2000)

Non-Patent Literature 4: R. Ugajin, Physica A 301, 1 (2001)

Non-Patent Literature 5: R. Ugajin, J. Nanotechnol. 1, 227 (2001)

Further, the inventor has theoretically revealed that it is possible to control the Mott metal-insulator transition by the use of the electric field effect in an array formed by aggregating a certain type of quantum dots (Non-Patent Literatures 6, 7, 8, and 9). In turn, it has been reported that it is possible to control a conductivity of a junction system consisting of a layer of a high impurity scattering and a layer of a high purity with a remarkably low impurity scattering by applying an electric field to the system (Non-Patent Literatures 10 and 11).

Non-Patent Literature 6: R. Ugajin, J. Appl. Phys. 76, 2833 (1994)

Non-Patent Literature 7: R. Ugajin, Physica E 1, 226 (1997)

Non-Patent Literature 8: R. Ugajin, Phys. Rev. B 53, 10141 (1996)

Non-Patent Literature 9: R. Ugajin, J. Phys. Soc. Jpn. 65, 3952 (1996)

Non-Patent Literature 10: H. Sakaki, Jpn. J. Appl. Phys. 21, L381 (1982)

Non-Patent Literature 11: K. Hirakawa, H. Sakaki, and J. Yoshino, Phys. Rev. Lett. 54, 1279 (1985)

Also, it has been reported that generation of quantum chaos is detected by using quantum level statistics (Non-Patent Literatures 12 and 13).

Non-Patent Literature 12: L. E. Reichl, The transition to chaos: in conservative classical systems: quantum manifestations (Springer, New York, 1992)

Non-Patent Literature 13: F. Haake, Quantum Signatures of chaos, (Springer-Verlag, 1991)

Also, the Berry-Robnik parameter $\rho$ is known as a parameter for quantitatively detecting a modulation in quantum chaos property (Non-Patent Literature 14), and it is known that p is a volume ratio of a regular region in a phase space in the scope of semi-classical approximation (Non-Patent Literature 15).

Non-Patent Literature 14: M. V. Berry and M. Robnik, J. Phys. A (Math. Gen.) 17, 2413 (1984)

Non-Patent Literature 15: B. Eckhardt, Phys. Rep. 163, 205 (1988)

In addition, the neutron transmutation doping (NTD) which is a method of doping a semiconductor through a nuclear reaction of neutrons of stable isotopes has been developed (Non-Patent Literature 16).

Non-Patent Literature 16: K. M. Itoh, E. E. Haller, W. L. Hansen, J. W. Beeman, J. W. Farmer, A. Rudnev, A. Tkhomirov, and V. I. Ozhogin, Appl. Phys. Lett. 64, 2121 (1994)

SUMMARY OF THE INVENTION

With the above-mentioned conventional quantum chaos generation methods, the range of the control on the quantum chaos property is limited. Therefore, a technology of more extensively controlling the quantum chaos property has been demanded. Further, in order to control the quantum chaos property more conveniently, it is desirable that the quantum chaos property be externally controlled.

Accordingly, an object of the present invention is to provide an electron device which controls quantum chaos wherein the quantum chaos property is extensively and externally controlled and a quantum chaos controlling method.

Another object of the invention is to provide an electron device which controls quantum chaos wherein the quantum chaos property is extensively and externally controlled when a single material is used and a quantum chaos controlling method.

The inventor has conducted intensive researches to solve the above problems of the conventional technologies and has found that, in a junction structure where a region which is in a metallic state and exhibits quantum chaos is bonded with a region which is in an Anderson localization state and has integrability, it is possible to more extensively control quantum chaos property of an electron system trapped in the structure by an electric field effect as compared with the conventional technologies and that it is possible to perform the extensive control externally and with the use of a single material.

It is known that GUE (Gaussian unitary ensemble) quantum chaos having a stronger nonlinearity is generated thanks to a random magnetic filed which is realized by an addition of a magnetic impurity such as manganese (Mn). The inventor has found that, in a junction structure where a region which is in a metallic state and exhibits GUE quantum chaos having a strong nonlinearity is bonded with a region which is in an Anderson localization state and has integrability, it is possible to extensively control a quantum chaos property of an electron system trapped in the structure by an electric field effect and that it is possible to perform the extensive control externally and with the use of a single material.

This invention has been accomplished as a result of studies conducted based on the above findings. More specifically, to solve the above problems, according to a first aspect of the invention, there is provided an electron device which controls quantum chaos comprising a heterojunction which is provided with a first region having an electron system characterized by quantum chaos and a second region having an electron system characterized by integrability, the first region and the second region being adjacent to each other, and the heterojunction being capable of exchanging electrons between the first region and the second region, wherein a quantum chaos property of an electron system in a system formed of the first region and the second region is controlled by applying to the heterojunction an electric field having a component perpendicular to at least a junction surface.

According to a second aspect of the invention, there is provided a quantum chaos control method comprising using a heterojunction which is provided with a first region having an electron system characterized by quantum chaos and a second region having an electron system characterized by integrability, the first region and the second region being adjacent to each other, and the heterojunction being capable of exchanging electrons between the first region and the second region, and controlling a quantum chaos property of an electron system in a system formed of the first region and the second region by applying to the heterojunction an electric field having a component perpendicular to at least a junction surface.

As used herein, "heterojunction" means a junction wherein the first region having the electron system characterized by quantum chaos and the second region having the electron system characterized by integrability are adjacent to (or contact with) each other, i.e., the heterojunction is the junction formed when two regions which are different in characteristic of electron system are adjacent to each other. The heterojunction may be formed either by using a single material or by using different materials. The electron system in the heterojunction is refereed to as heterotic phase. A double heterojunction may be formed by providing the first regions on each sides of the second region, i.e., by sandwiching the second region by the first regions. Likewise, the double heterojunction may be formed by providing the second regions on each sides of the first region, i.e., by sandwiching the first region by the second regions. The electron system in the double heterojunction is referred to as double heterotic phase.

The types of the materials to be used for the heterojunction are particularly not limited. Specific examples of the materials may be semiconductors (elementary semiconductors such as Si and Ge; III–V compound semiconductors such as GaAs, GaP, and GaN; II–VI compound semiconductor such as ZnSe). Each of the first region and the second region may typically be crystalline and generally has the shape of a layer. More specifically, the heterojunction is formed by growing a crystal layer which serves as the first region and a crystal layer which serves as the second region through various crystal growth methods. A transition region may sometimes be present in a boundary region between the first region and the second region, but there is no fundamental difference in terms of expression of necessary physicality when the transition region is present.

The first region having the electron system characterized by quantum chaos is typically in a metallic state, and the second region having the electron system characterized by integrability typically has a random medium or a random magnetic field is present in the second region. The random medium is not particularly limited so far as a random potential works with electrons, and typical examples thereof may be impurity and a lattice defect. The random magnetic field is typically generated by an addition of magnetic impurity such as Mn.

In the above-described heterojunction, a maximum length in a direction along the junction surface may favorably be less than a coherence length of electrons from the standpoint of quantum chaos expression.

An electrode for electric field application is ordinarily provided for the purpose of applying to the heterojunction an electric field having a component perpendicular at least to the junction surface. For example, the electrode is provided in at least one of the first region and the second region included in the heterojunction. In this case, an insulating film is provided for the purpose of electrical insulation of the electrode. Particularly, in the case where each of the first region and the second region has the layer shape, the insulating film is formed on at least one of the first region and the second region to provide the electrode.

In the electron device which controls quantum chaos, a wiring for inputting/outputting an electric signal is provided in addition to the heterojunction and the electrode when so required.

The above-described electric field application, i.e. the control on the quantum chaos by the electric field effect, accompanies the Anderson transition which is a metal/insulator transition; however, by setting a transfer between the first region and the second region to be equal or less than a transfer in the first region or a transfer in the second region, preferably to be sufficiently less (to be $2/3$ or less, for example) than the transfers in the first region and the second region, it is possible to rapidly cause the Anderson transition using the electric field effect. In order to set the above transfers, a tunnel barrier region is provided between the first region and the second region. Typical examples of the above structure may be such that each of the first region and the second region is formed from GaAs and the tunnel barrier region is formed from AlGaAs. Also, in order to manifest an effect of this invention favorably at a high temperature, it is effective to employ a structure formed by using materials having a larger band offset, wherein each of the first region and the second region is formed from InGaAs and the tunnel barrier region is formed from AlGaAs.

In this invention, it is possible to control critical field intensity with which a transition from quantum chaos to an integrable system occurs by controlling a Fermi level of the electron system. Therefore, by setting the Fermi level of the electron system to a predetermined value in addition to the above electric field application, it is possible to extensively control the quantum chaos property of the electron system. It is possible to control the Fermi level of the electron system by controlling a density of the electron system.

According to the invention with the above-described constitution, by applying an electric field to the heterojunction formed of the first region having the electron system characterized by quantum chaos and the second region having the electron system characterized by integrability, it is possible to universally control the electron system of the system including the first region and the second region from the state showing a typical quantum chaos to the state showing the Anderson localization. Further, this control is achieved irrelevant from the types of materials used for forming the heterojunction. Also, by performing the control on the Fermi level in combination with the electric field application, it is possible to extensively control the quantum chaos property. Further, it is possible to cause the Anderson transition rapidly by keeping the transfer between the first region and the second region to be equal to or less than the transfers in the first region and the second region.

According to the invention, the heterojunction is formed by providing thereto the first region having the electron system characterized by quantum chaos and the second region having the electron system characterized by integrability in such a fashion that the first region and the second region are adjacent to each other and electrons are exchanged between the first region and the second region, and the electric field having the component perpendicular at least to the junction surface is applied to the heterojunction, thereby enabling to extensively and externally control the quantum chaos property of an electron system of a system formed of the first region and the second region. Further, the extensive control is achieved with the use of a single material. Also, by properly setting the transfers, it is possible to rapidly cause the Anderson transition. Also, by controlling the Fermi level of the electron system in addition to the electric field application, it is possible to more extensively control the quantum chaos property of the electronic system. Also, by using the double heterotic phase, it is possible to more extensively control the quantum chaos property.

DESCRIPTION OF THE PREFERRED EMBODIMENTS

Embodiments of the invention will hereinafter be described.

First Embodiment:

In the first embodiment, an electron device which controls quantum chaos using a heterojunction which is a junction system of a region having an electron system characterized by quantum chaos and a region having an electron system characterized by integrability will be described.

Before describing the first embodiment, electrons on a two-dimensional square lattice, more specifically an electron state in a two-dimensional random potential, will be described.

Figure 1:
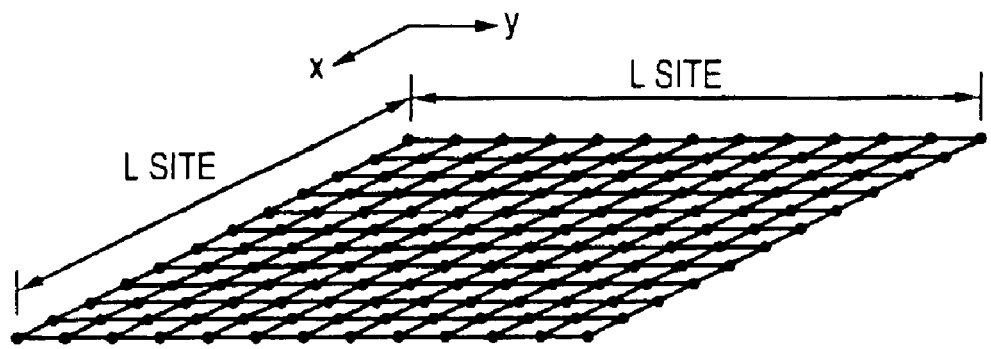
FIG. 1 is a schematic diagram illustrating an electron state in a two-dimensional random potential.

Referring to FIG. 1, each side of the square lattice is L site, and dots indicate lattice points. An operator for generating quantum $\hat{c}_p^\dagger$ is defined on a p-th lattice point of the square lattice. Here, Hamiltonian $\hat{H}_2$ of a quantum system is defined as follows:

$$\hat{H}_2 = -t \sum_{\langle p,q \rangle} \hat{c}_p^\dagger \hat{c}_q + \sum_p v_p \hat{c}_p^\dagger \hat{c}_p + H.C. \qquad (1)$$

Note that, in the equation (1), <p, q> means the adjacent sites; t is a transfer; and a random potential is introduced by $v_p$. Here, $v_p$ is a random variable generated by:

$$-V/2 < v_p < V/2 \qquad (2).$$

It is possible to introduce the random potential by, for example, adding impurity or introducing a lattice defect.

The Anderson localization occurs to cause an insulation state when V/t is sufficiently large, while a metallic Fermi liquid is constructed when V/t is sufficiently small. It is known that all single electron states are localized in an infinite two-dimensional system unless intensity of the random potential is zero no matter how weak the intensity is. However, since a length of the localization is finite, the system behaves as if it is in the metallic state in the finite region so far as the localization length is larger than the size of the system (La when a distance from a lattice point to an adjacent lattice point is a).

When intrinsic energy of Hamiltonian $\hat{H}_2$ is $\epsilon_m$ and intrinsic vector of Hamiltonian is |m>, the following equation:

$$\hat{H}_2 |m\rangle = \epsilon_m |m\rangle \qquad (3)$$

is true. In the equation (3), m=0, 1, 2, or n.

To start with, an n+1 quantum level $\epsilon_m$ is standardized in such a manner that its average nearest level spacing becomes 1. That is to say, the following equation:

$$w_j = \epsilon_j - \epsilon_{j-1} \qquad (4)$$

is used. When j=1, 2, or n in the equation (4), the quantum level is converted into a new level:

$$\epsilon_0 = 0 \qquad (6)$$

$$\varepsilon_m = \frac{1}{\bar{\omega}} \sum_{j=1}^m \omega_j = \sum_{j=1}^m \Omega_j \qquad (7)$$

using the following equation:

$$\bar{\omega} = \frac{1}{n} \sum_{j=1}^n \omega_j. \qquad (5)$$

Here, the following equation:

$$\Omega_j = \frac{\omega_j}{\bar{\omega}} \qquad (8)$$

is true.

The density of states of the system is defined by the following equation:

$$\rho(\epsilon) = \frac{1}{n+1} \sum_{m=0}^n \delta(\epsilon - \varepsilon_m), \qquad (9)$$

and the staircase function is calculated as follows:

$$\lambda(\epsilon) = \int_{-\infty}^\epsilon d\eta \rho(\eta) \qquad (10)$$

The thus-obtained staircase function is converted by using the operation called unfolding in such a manner that the density of states is constant on average. The thus-obtained quantum levels are used for calculating a nearest level spacing distribution P(s) and $\Delta_3$ statistics of Dyson and Mehta as quantum level statistics. As mentioned in Non-Patent Literatures 12 and 13, the statistics are used for detecting whether or not the quantum chaos is generated. It is known that the quantum chaos system is sensitive to external perturbation as is the case with the classical chaos system, and, therefore, the quantum chaos analysis is important as an index for nonlinear material designing.

In the case of the integrable system, the nearest level spacing distribution P(s) and the $\Delta_3$ statistics are well described as those of the Poisson distribution as follows:

$$P_p(s) = e^{-\epsilon} \qquad (11)$$

$$\Delta_3(n) = \frac{n}{15}. \qquad (12)$$

In the case of the quantum chaos system, they are well described as those of GOE (Gaussian orthogonal ensemble) distribution as follows:

$$P_{GOE}(s) = \frac{\pi s}{2} e^{-\pi s^2/4} \tag{13}$$

$$\Delta_3(n) = \frac{1}{\pi^2}\left[\log(2\pi n) + \gamma - \frac{\pi^2}{8} - \frac{5}{4}\right] + O(n^{-1}). \tag{14}$$

In the equations (13) and (14), $\gamma$ is the Euler's constant. In the following calculations, L is set to 40 (L=40) and a periodic boundary condition is used. The total number of states is 1,600 ($L^2$=1,600). The quantum levels of from n=201 to n=800 are used. The quantum chaos property is controlled by fixing t to 1 (t=1) and adjusting V.

Figure 2:
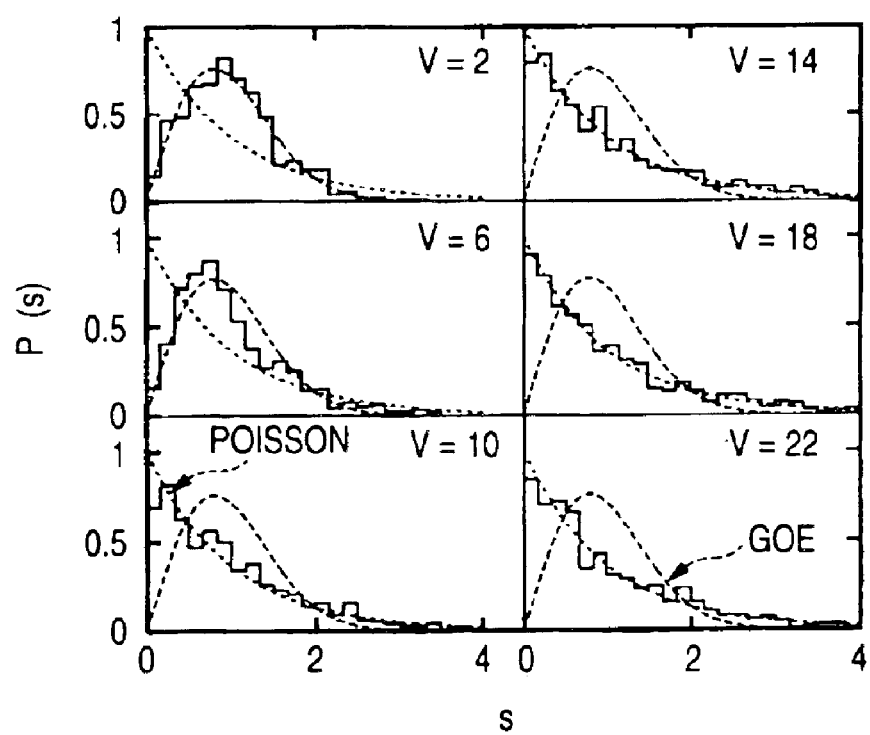
FIG. 2 is a schematic diagram showing results obtained by a simulation using the model shown in FIG. 1.
Figure 3:
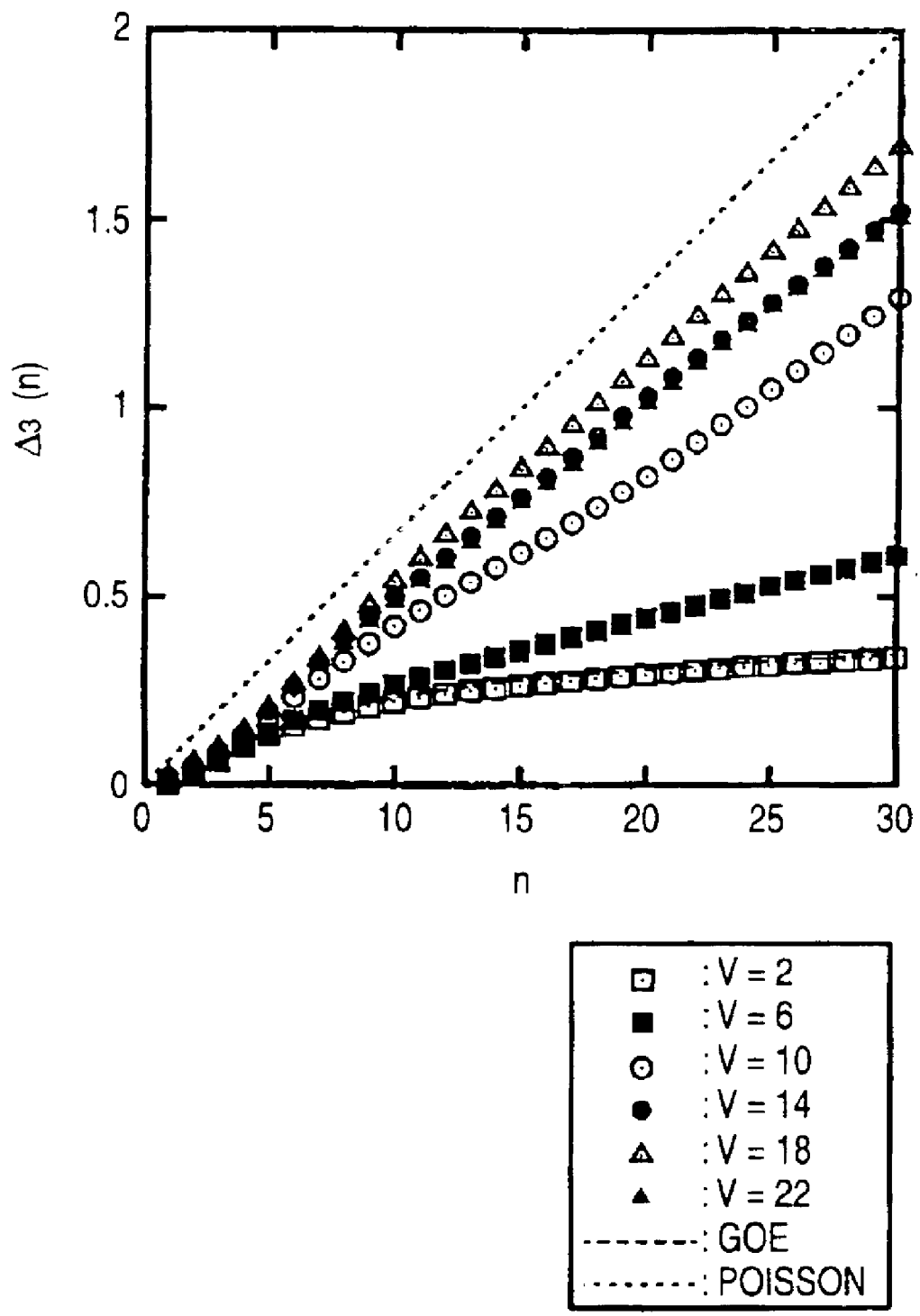
FIG. 3 is a schematic diagram showing results obtained by a simulation using the model shown in FIG. 1.

The nearest level spacing distribution P(s) is shown in FIG. 2, and the $\Delta_3$ statistics are shown in FIG. 3. V is set to 2, 6, 10, 14, 18, and 22. In the case of V=2, the quantum level statistics of the system are well described as those of GOE and the system is in the metallic quantum chaos state. In the case of V=22, the quantum level statistics of the system are well described as those of the Poisson distribution and the system is in the Anderson localization state (the integrable system). A change from the quantum chaos system to the integrable system along with the change from V=2 to V=22 is observed.

The electron device which controls quantum chaos according to the first embodiment will hereinafter be described.

Figure 4:
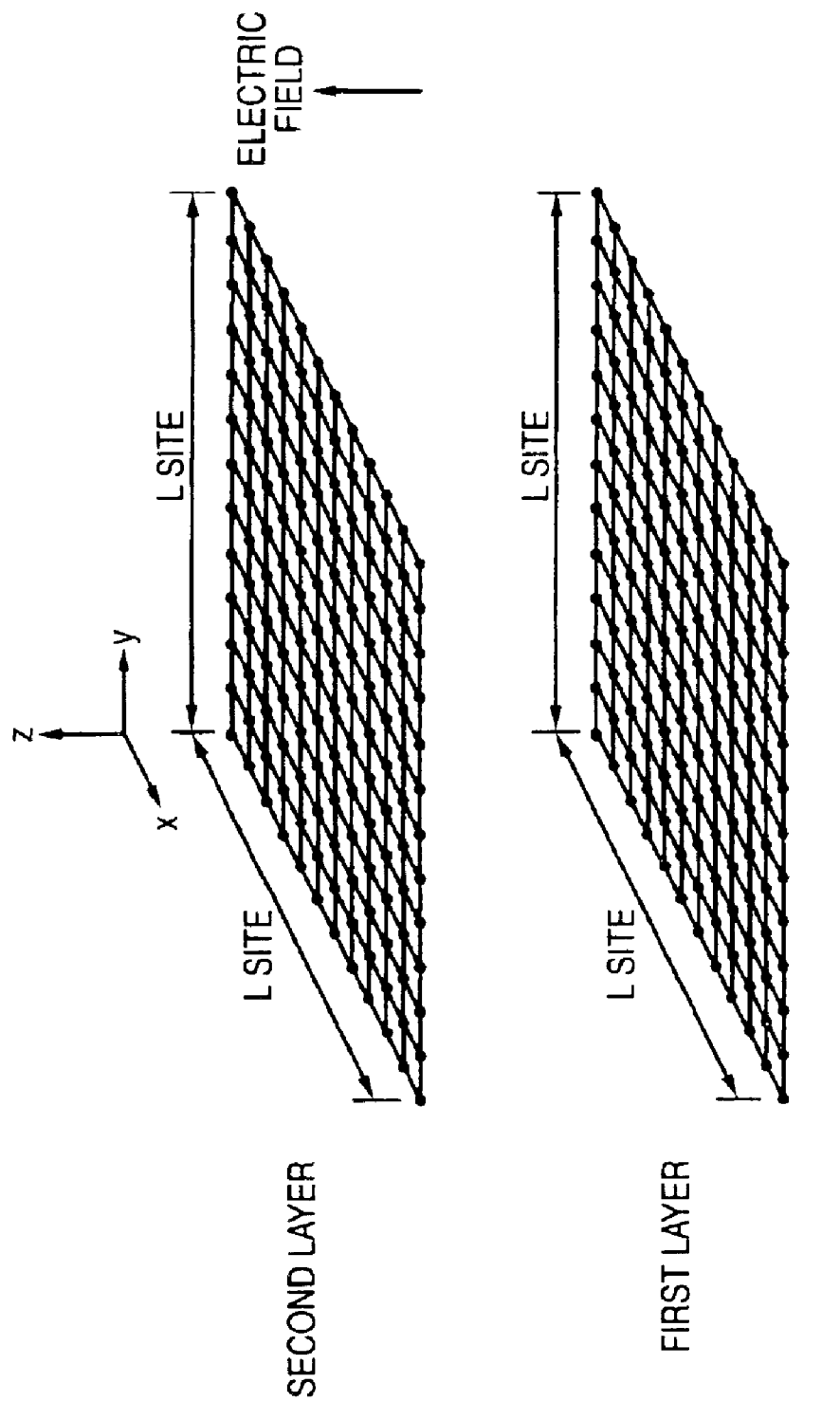
FIG. 4 is a schematic diagram showing a main part of an electron device which controls quantum chaos according to a first embodiment of the invention.

As shown in FIG. 4, two layers of the square lattice of which each side is L site are considered. The two layers form a heterojunction. The maximum dimension of the layers ($\sqrt{2}$La when a distance between adjacent lattice points is a) is smaller than an electron coherence length. An operator: $\hat{c}_p^\dagger$ for generating quantum is defined on a p-th lattice point of the first layer. An operator: $\hat{d}_p^\dagger$ for generating quantum is defined on a p-th lattice point of the second layer. Here, Hamiltonian $\hat{H}$ of the quantum system is defined by the following equation:

$$\hat{H} = -t_1 \sum_{\langle p,q \rangle} \hat{c}_p^\dagger \hat{c}_q - t_2 \sum_{\langle p,q \rangle} \hat{d}_p^\dagger \hat{d}_q - t_3 \sum_p \hat{c}_p^\dagger \hat{d}_q + \sum_p v_p \hat{c}_p^\dagger \hat{c}_p + \sum_p \omega_p \hat{d}_p^\dagger \hat{d}_p + \frac{\phi}{2}\sum_p \left(\hat{c}_p^\dagger \hat{c}_p - \hat{d}_p^\dagger \hat{d}_p\right) + H.C. \tag{15}$$

In the equation (15), <p, q> means nearest sites in the layers; $t_1$ is a transfer of the first layer; $t_2$ is a transfer of the second layer; and $t_3$ is a transfer between the first layer and the second layer. A random potential of the first layer is introduced by $v_p$. Here, $v_p$ is a random variable generated by:

$$-V_1/2 < v_p < V_1/2 \tag{16}$$

A random potential of the second layer is introduced by $w_p$. Here, $w_p$ is a random variable generated by:

$$-V_2/2 < w_p < V_2/2 \tag{17}$$

It is possible to introduce the random potentials by, for example, adding impurity or introducing a lattice defect.

In this case, one of the first layer and the second layer serves as a region having an electron system characterized by quantum chaos and the other serves as a region having an electron system characterized by integrability depending on the values of $V_1/t_1$ and $V_2/t_2$. For example, when $V_1/t_1 < V_2/t_2$, the first layer serves as the region having the electron system characterized by quantum chaos and the second layer serves as the region having the electron system characterized by integrability.

Electrodes are provided under the first layer and on the second layer, and each of the electrodes having the size which is large enough to cover whole surface of the layer. By applying a voltage between the electrodes, an electric field in a direction of z-axis is applied uniformly in such a manner as to penetrate the layers.

In the case of $t_3$=0, which is the simplest case wherein the first layer and the second layer are separated from each other, the first layer is in the state of metallic Fermi liquid when $V_1/t_1$ is sufficiently small, while the Anderson localization occurs in the second layer so that the second layer is in the insulation state when $V_2/t_2$ is sufficiently large.

In the case of $t_3$>0, the two layers form a quantum junction. An average potential difference $\phi$ between the two layers is introduced, and this parameter is in proportion to intensity of the electric field penetrating the layers. Changes in the quantum state of the system using $\phi$ as the parameter are important.

In the following calculations, L is set to 40 (L=40) and a periodic boundary condition is used for each of the layers. The total number of states is 3,200 ($2L^2$=3,200). Intrinsic energy values are obtained by dinagonalization, and quantum level statistics are calculated from the above-described method. The quantum levels of from n=201 to n=800 are used. The quantum chaos property is controlled by fixing the values of $t_1$, $t_2$, $t_3$, $V_1$, and $V_2$ as follows: $t_1$=$t_2$=1; $t_3$=0.5; $V_1$=2; and $V_2$=20 as well as by adjusting the value of $\phi$.

Figure 5:
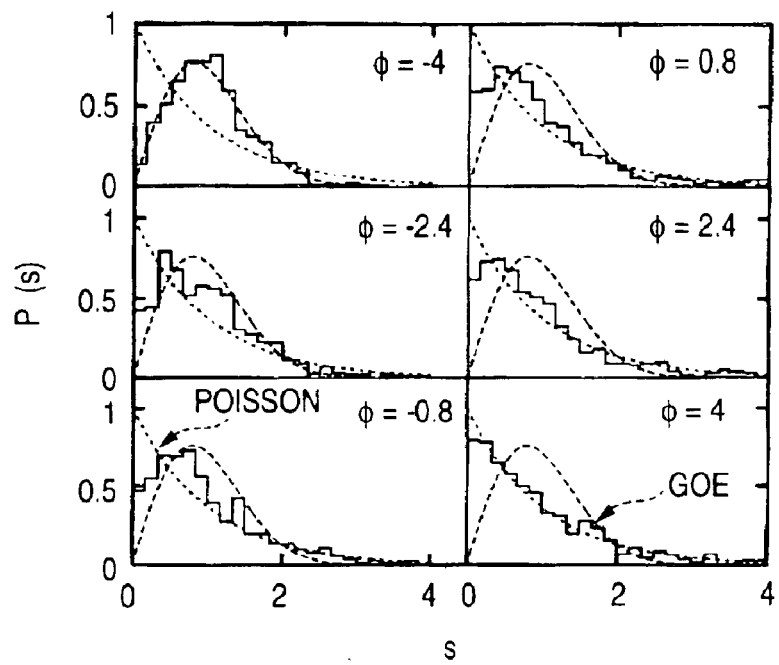
FIG. 5 is a schematic diagram showing results obtained by a simulation according to the first embodiment of the invention.
Figure 6:
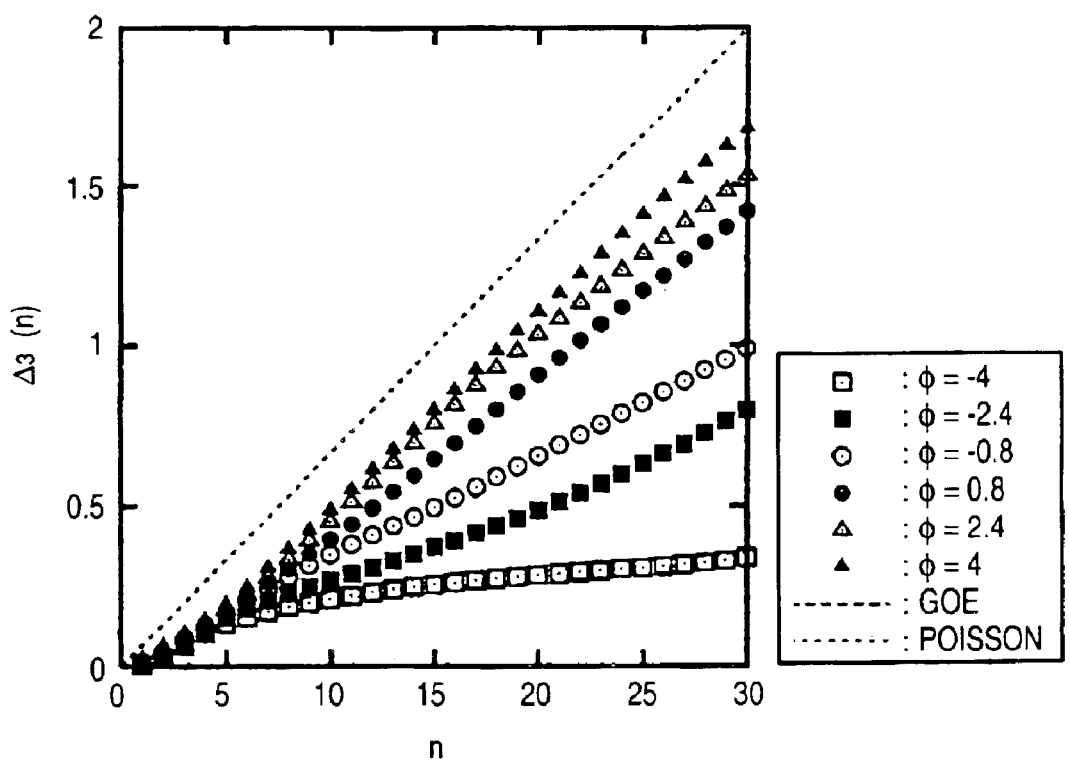
FIG. 6 is a schematic diagram showing results obtained by a simulation according to the first embodiment of the invention.

Shown in FIG. 5 is a nearest level spacing distribution P(s), and shown in FIG. 6 is $\Delta_3$ statistics. The values used for $\phi$ are −4, −2.4, −0.8, 0.8, 2.4, and 4. When $\phi$ is −4, electrons with large amplitude are present in the first layer having lower potential energy. In this case, the electrons are in the quantum chaos state which is well described by the GOE distribution. Along with the increase in $\phi$, amplitude in the second layer having a violent scattering due to the random potential is increased and the quantum level statistics are changed. When $\phi$=4, the electrons with large amplitude are present in the second layer having lower potential energy to cause the Anderson localization in accordance with the Poisson distribution which is integrable.

From the above analysis, it is apparent that the quantum chaos property of the quantum system is controlled owing to changes in value of $\phi$, i.e., owing to changes in intensity of the electric field penetrating the two layers.

In addition, in Non-Patent Literatures 10 and 11, Sakaki et al. discuss switching between the Anderson localization state and the metallic state only in terms of conductivity.

Figure 7:
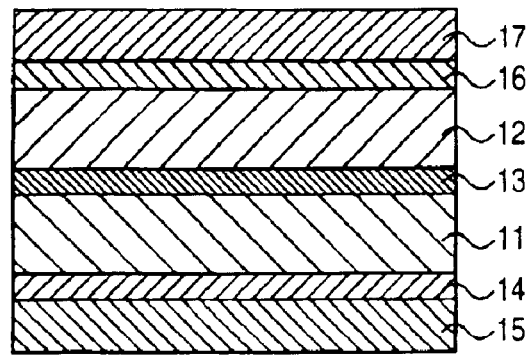
FIG. 7 is a sectional view showing a specific example of the electron device which controls quantum chaos according to the first embodiment of the invention.

A specific example of the electron device which controls quantum chaos according to the first embodiment is shown in FIG. 7. Referring to FIG. 7, in the electron device which controls quantum chaos, a crystal layer 11 as the first layer and a crystal layer 12 as the second layer are quantum-mechanically bonded with each other with a crystal layer 13 as a tunnel barrier being sandwiched therebetween to form a heterojunction. The crystal layer 11 as the first layer is undoped and high in purity, while the crystal layer 12 as the second layer is doped with a high concentration ((1 to 2)×$10^{18}$ $cm^3$, for example) of impurity. An electrode 15 is formed on a bottom face of the crystal layer 11 with an insulating film 14 being formed therebetween, and an electrode 17 is formed on a top face of the crystal layer 12 with an insulating film 16 being formed therebetween.

Figure 8A:
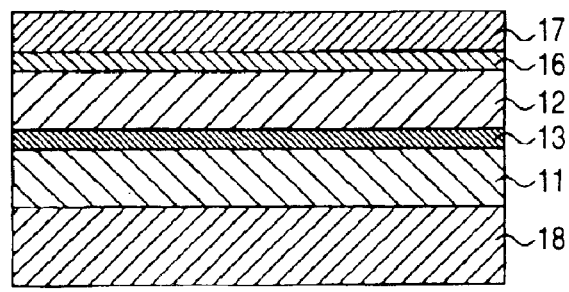
FIG. 8 is a sectional view showing a manufacturing method of the electron device which controls quantum chaos according to the first embodiment of the invention.
Figure 8B:
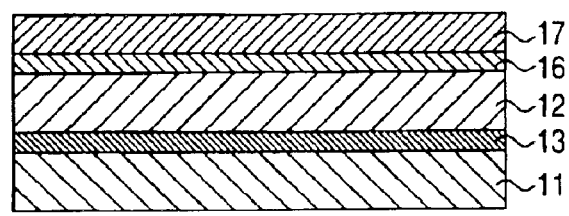
Figure 8C:
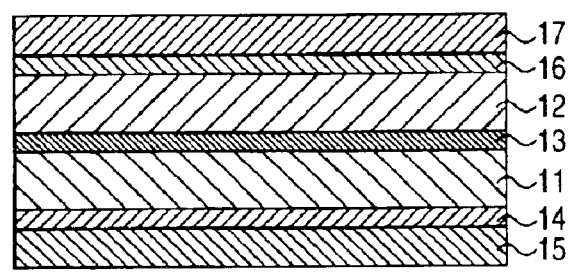

It is possible to produce the electron device which controls quantum chaos by, for example, the following process. As shown in FIG. 8A, the crystal layers 11, 13, and 12 are grown in this order on a substrate 18. Examples of usable crystal growth method may be the metal organic chemical vapor deposition (MOCVD), the molecular beam epitaxy (MBE), and the like. The crystal layer 12 is doped with impurity which is in an amount necessary for the crystal growth. The insulating film 16 is formed on the crystal layer 12, and an electroconductive film such as a metal film is formed on the insulating film 16 to form the electrode 17 on the electroconductive film. Then, referring to FIG. 8B, the substrate 18 is removed by polishing from the bottom face. Referring to FIG. 8C, the insulating film 14 is formed under the thus-exposed crystal layer 11, and an electroconductive film such as a metal film is formed under the insulating film 14 to form the electrode 15 on the electroconductive film. Then, the stacked structure is patterned to be in a predetermined shape by lithography and etching. Thus, the electron device which controls quantum chaos shown in FIG. 7 is obtained.

Specific examples of usable materials are as follows: an undoped GaAs layer is used for the crystal layer 11; an Si doped GaAs layer is used for the crystal layer 12; an undoped AlGaAs layer (Al composition is 0.3, for example) is used for the crystal layer 13; an SiO$_2$ film is used for the insulating films 14 and 16, an Al film is used for the electrodes 15 and 17; and a semi-insulation GaAs substrate is used for the substrate 18.

Figure 9:
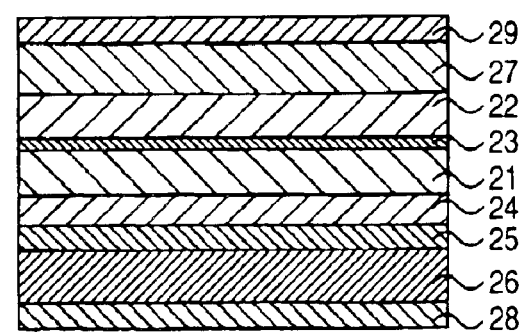
FIG. 9 is a sectional view showing another example of the electron device which controls quantum chaos according to the first embodiment of the invention.

Shown in FIG. 9 is another example of the electron device which controls quantum chaos according to the first embodiment. Referring to FIG. 9, in the electron device which controls quantum chaos, a crystal layer 21 as the first layer and a crystal layer 22 as the second layer are quantum-mechanically bonded with each other with a crystal layer 23 as a tunnel barrier being sandwiched therebetween to form a heterojunction. The lattice defect does not substantially exist in the crystal layer 21 serving as the first layer (or there is a remarkably small amount of lattice defect), and an amount of the lattice defect in the crystal layer 22 serving as the second layer is at least larger than that of the crystal layer 21. Under the crystal layer 21, a crystal layer 24 as a spacer layer, a crystal layer 25 as an electron supplying layer, and a crystal layer 26 as an insulating layer are stacked in this order, while a crystal layer 27 as an insulating layer is stacked on the crystal layer 22. An electrode 28 is formed on a bottom face of the crystal layer 26, while an electrode 29 is formed on a top face of the crystal layer 27.

Since a manufacturing process of the electron device which controls quantum chaos is almost the same as that of the electron device which controls quantum chaos shown in FIG. 7, description thereof is omitted.

Specific examples of usable materials are as follows: an undoped GaAs layer is used for the crystal layers 21 and 22; an undoped AlGaAs layer (Al composition is 0.3, for example) is used for the crystal layers 23, 24, 26, and 27; an Si doped AlGaAs layer (Al composition is 0.3, for example) is used for the crystal layer 25; and an Al film is used for the electrodes 28 and 29.

In the electron device which controls quantum chaos of FIG. 9, the system behaves as a metal when the electrons supplied from the crystal layer 25 are present in the crystal layer 21 having no lattice defect, and the system behaves as if it is in the metallic state transitions to the Anderson localization phase when the electrons are attracted to the crystal layer 22 having lattice defect due to the potential difference between the electrodes 28 and 29.

As described in the foregoing, according to the first embodiment, the heterojunction is formed by bonding the region having the electron system characterized by quantum chaos with the region having the electron system characterized by integrability, and the electric field perpendicular to the junction surface is applied to the heterojunction to externally and extensively control the quantum chaos property of the electron system in the system formed of the regions in such simple manner. Further, it is possible to form the heterojunction simply by using a single material.

Second Embodiment:

An electron device which controls quantum chaos according to the second embodiment uses a heterojunction which is a junction system of a region having an electron system characterized by quantum chaos and a region having an electron system characterized by integrability, and magnetic impurity is particularly used as impurity for introducing a random potential in this case.

Before describing the second embodiment, electrons on a two-dimensional square lattice, more specifically an electron state in a two-dimensional random potential, will be described.

As shown in FIG. 1, each side of the square lattice is L site. An operator $\hat{c}_p^\dagger$ for generating quantum is defined on a p-th lattice point of the square lattice. Here, Hamiltonian $\hat{H}_2$ of a quantum system is defined as follows:

$$\hat{H}_2 = -\sum_{\langle p,q \rangle} t_{p,q} \hat{c}_p^\dagger \hat{c}_q + \sum_p v_p \hat{c}_p^\dagger \hat{c}_p + H.C. \tag{18}$$

In the equation (18), <p, q> means the adjacent sites, and the random potential is introduced by $v_p$. Here, $v_p$ is a random variable generated by:

$$-V/2 < v_p < V/2 \tag{19}$$

It is possible to introduce the random potential by, for example, adding impurity or introducing a lattice defect. The transfer $t_{p,q}$ is defined by the following equation:

$$t_{p,q} = \exp(2\pi i \theta_{p,q}) \tag{20},$$

wherein $\theta_{p,q}$ satisfies $\theta_{p,q} = -\theta_{p,q}$ and is a random variable generated by $|\theta_{p,q}| < \xi/2$. A random magnetic field is introduced when $\xi > 0$ is satisfied.

The Anderson localization occurs to cause an insulation state when V is sufficiently large, while a metallic Fermi liquid is constructed when V is sufficiently small. As mentioned in the foregoing, it is known that all single electron states are localized in an infinite two-dimensional system unless intensity of the random potential is zero no matter how weak the intensity is. However, since a length of the localization is finite, the system behaves as if it is in the metallic state in the finite region when the localization length is larger than the size of the system La.

When intrinsic energy of Hamiltonian $\hat{H}_2$ is $\epsilon_m$ and an intrinsic vector of Hamiltonian is |m>, the following equation:

$$\hat{H}_2|m\rangle = \epsilon_m|m\rangle \tag{21}$$

is derived. In the equation (21), m=0, 1, 2, or n.

To start with, an n+1 quantum level $\epsilon_m$ is standardized in such a manner that its average nearest level spacing becomes 1. That is to say, the following equation:

$$w_j = \epsilon_j - \epsilon_{j-1} \tag{22}$$

is true. When j=1, 2, or n, the quantum level is converted into a new level:

$$\epsilon_0 = 0 \tag{24}$$

$$\varepsilon_m = \frac{1}{\overline{\omega}} \sum_{j=1}^{m} \omega_j = \sum_{j=1}^{m} \Omega_j \quad (25)$$

using the following equation:

$$\overline{\omega} = \frac{1}{n} \sum_{j=1}^{n} \omega_j. \quad (23)$$

Here, the following equation:

$$\Omega_j = \frac{\omega_j}{\overline{\omega}} \quad (26)$$

is used. The density of states of the system is defined by the following equation:

$$\rho(\epsilon) = \frac{1}{n+1} \sum_{m=0}^{n} \delta(\epsilon - \varepsilon_m), \quad (27)$$

and the staircase function is calculated as follows:

$$\lambda(\epsilon) = \int_{-\infty}^{\epsilon} d\eta \rho(\eta) \quad (28)$$

The thus-obtained staircase function is converted by employing the operation called unfolding in such a manner that the density of states is constant on average. The thus-obtained quantum level is used for calculating a nearest level spacing distribution P(s) and Δ3 statistics of Dyson and Mehta as quantum level statistics. As mentioned in the foregoing, the statistics are used for detecting whether or not the quantum chaos is generated.

In the case of the integrable system, the nearest level spacing distribution P(s) and the $\Delta_3$ statistics are well described as those of the Poisson distribution as follows:

$$P_p(s) = e^{-\epsilon} \quad (29)$$

$$\Delta_3(n) = \frac{n}{15}. \quad (30)$$

In the case of the quantum chaos system, they are well described as those of GUE (Gaussian unitary ensemble) distribution as follows:

$$P_{GUE}(s) = \frac{32 s^2}{\pi^2} e^{-4s^2/\pi} \quad (31)$$

$$\Delta_3(n) = \frac{1}{2\pi^2} \left[ \log(2\pi n) + \gamma - \frac{5}{4} \right] + O(n^{-1}). \quad (32)$$

In the equations (31) and (32) γ is the Euler's constant.

In the following calculations, L is set to 60 (L=60) and a periodic boundary condition is used. The total number of states is 3,600 ($L^2$=3,600). The quantum levels of from n=201 to n=1,800 are used. The quantum chaos property is controlled by fixing ξ to 0.1 (ξ=0.1) and adjusting V.

Figure 10:
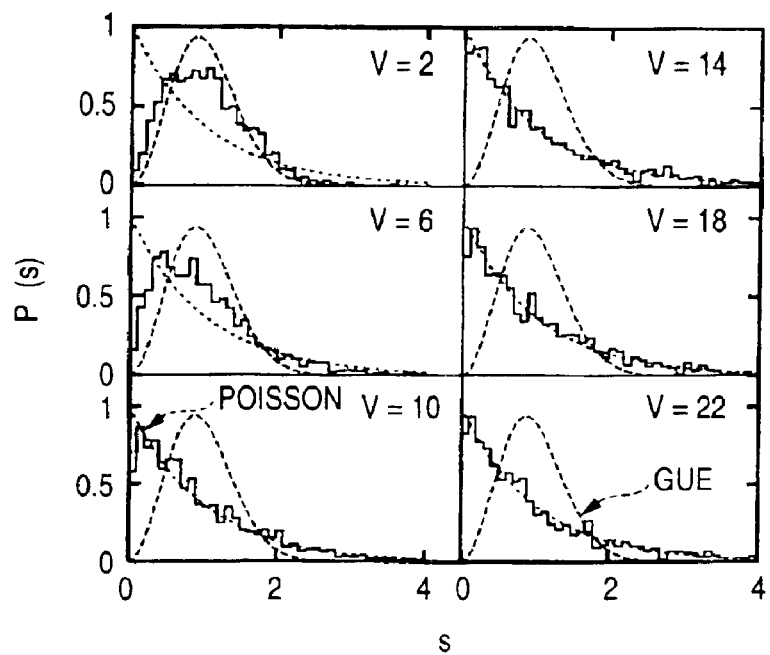
FIG. 10 is a schematic diagram showing results obtained by a simulation using the model shown in FIG. 1.
Figure 11:
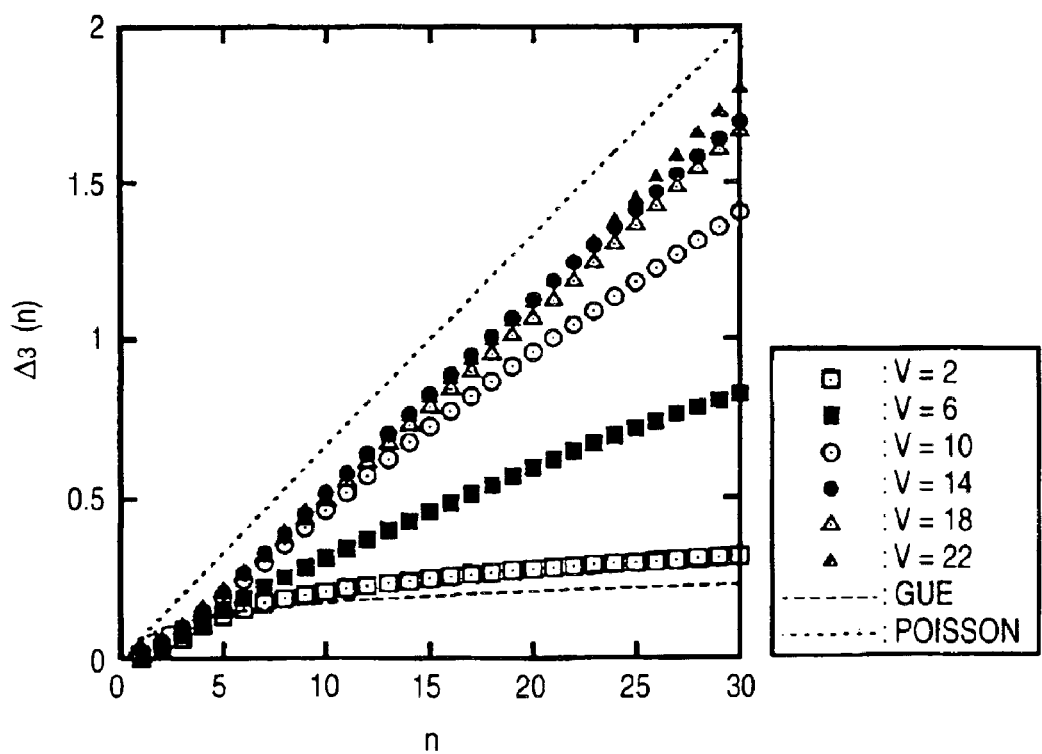
FIG. 11 is a schematic diagram showing results obtained by a simulation using the model shown in FIG. 1.

The nearest level spacing distribution P(s) is shown in FIG. 10, and the Δ3 statistics are shown in FIG. 11. Values used for V are 2, 6, 10, 14, 18, and 22. In the case of V=2, the quantum level statistics of the system are approximately described as those of GUE and the system is in the metallic quantum chaos state. In a closer observation, a shift from the quantum chaos system is observed. Since the system is two-dimensional, such shift is caused by the influence of the Anderson localization. In the case of V=22, the quantum level statistics of the system are well described as those of Poisson distribution, and the system is in the Anderson localization state (the integrable system). A change from the quantum chaos system to the integrable system along with the change from V=2 to V=22 is observed.

The electron device which controls quantum chaos according to the second embodiment will hereinafter be described.

As shown in FIG. 4, two layers of square lattice wherein each side is L site are considered as in the first embodiment. The two layers form a heterojunction. The maximum dimension of the layers (√2La when a distance between adjacent lattice points is a) is equal to or less than an electron coherence length. An operator $\hat{c}_p^\dagger$ for generating quantum is defined on a p-th lattice point of the first layer. An operator $\hat{d}_p^\dagger$ for generating quantum is defined on a p-th lattice point of the second layer. Here, Hamiltonian $\hat{H}$ of the quantum system is defined by the following equation:

$$\hat{H} = -\sum_{\langle p,q \rangle} t_{p,q}^{(1)} \hat{c}_p^\dagger \hat{c}_q - \sum_{\langle p,q \rangle} t_{p,q}^{(2)} \hat{d}_p^\dagger \hat{d}_q - \sum_{p} t_p^{(3)} \hat{c}_p^\dagger \hat{d}_p + \quad (33)$$

$$\sum_p v_p \hat{c}_p^\dagger \hat{c}_p + \sum_p w_p \hat{d}_p^\dagger \hat{d}_p + \frac{\phi}{2} \sum_p \left( \hat{c}_p^\dagger \hat{c}_p - \hat{d}_p^\dagger \hat{d}_p \right) + H.C.$$

In the equation (33), <p, q> means nearest sites in each of the layers. A random potential of the first layer is introduced by $v_p$. Here, $v_p$ is a random variable generated by:

$$-V_1/2 < v_p < V_1/2 \quad (34).$$

A random potential of the second layer is introduced by $w_p$. Here, $w_p$ is a random variable generated by:

$$-V_2/2 < w_p < V_2/2 \quad (35).$$

It is possible to introduce the random potentials by, for example, adding impurity or introducing a lattice defect. The transfers $t_{p,q}^{(1)}$, $t_{p,q}^{(2)}$, $t_p^{(3)}$ are represented by the following equations:

$$t_{p,q}^{(1)} = t_1 \exp(2\pi i \theta_{p,q}^{(1)}) \quad (36)$$

$$t_{p,q}^{(2)} = t_2 \exp(2\pi i \theta_{p,q}^{(2)}) \quad (37)$$

$$t_{p,q}^{(3)} = t_3 \exp(2\pi i \theta_{p,q}^{(3)}) \quad (38)$$

The transfers satisfy the following equations:

$$\theta_{p,q}^{(1)} = -\theta_{q,p}^{(1)}, \theta_{p,q}^{(2)} = -\theta_{q,p}^{(2)}$$

and are random variables generated by:

$$|\theta_{p,q}^{(1)}| < \xi/2, |\theta_{p,q}^{(2)}| < \xi/2, |\theta_p^{(3)}| < \xi/2.$$

A random magnetic field is introduced when ξ>0 is satisfied.

In the case of $t_3$=0, which is the simplest case wherein the first layer and the second layer are separated from each other, the first layer is in the metallic Fermi liquid state when $V_1/t_1$ is sufficiently small, while the Anderson localization occurs in the second layer so that the second layer is in the insulation state when $V_2/t_2$ is sufficiently large.

In the case of $t_3$>, the two layers form a quantum junction. An average potential difference φ between the two layers is introduced, and this parameter is in proportion to intensity of the electric field penetrating the layers. Changes in the quantum state of the system using φ as the parameter are important.

In the following calculations, L is set to 60 (L=60) and a periodic boundary condition is used for each of the layers. The total number of states is 7,200 (2L²=7,200). Intrinsic energy values are obtained by dinagonalization, and quantum level statistics are calculated from the above-described method. The quantum levels of from n=201 to n=1,800 are used. The quantum chaos property is controlled by fixing the values of $t_1$, $t_2$, $t_3$, $V_1$, $V_2$, and $\xi$, as follows: $t_1=t_2=1$; $t_3=0.5$; $V_1=1$; $V_2=12$; and $\xi=0.1$ as well as by adjusting the value of $\phi$.

Figure 12:
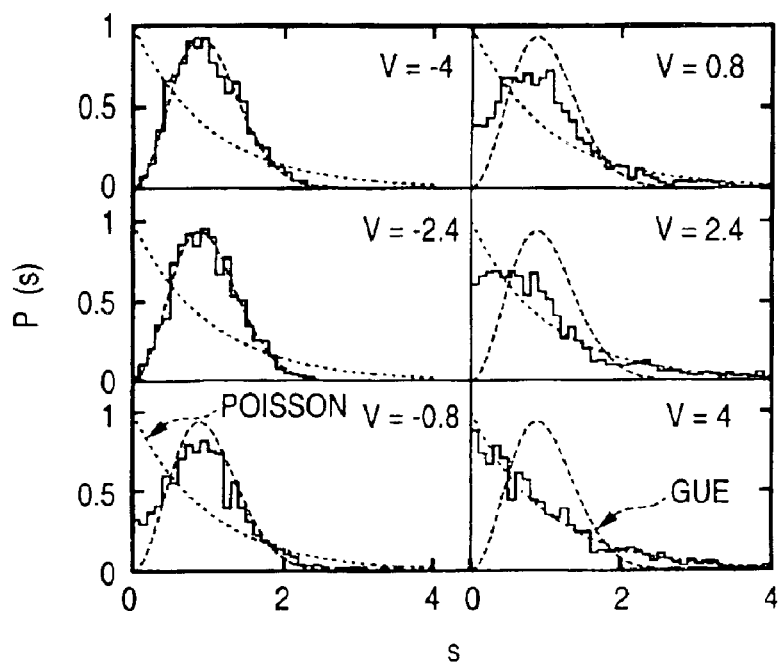
FIG. 12 is a schematic diagram showing results obtained by a simulation according to a second embodiment of the invention.
Figure 13:
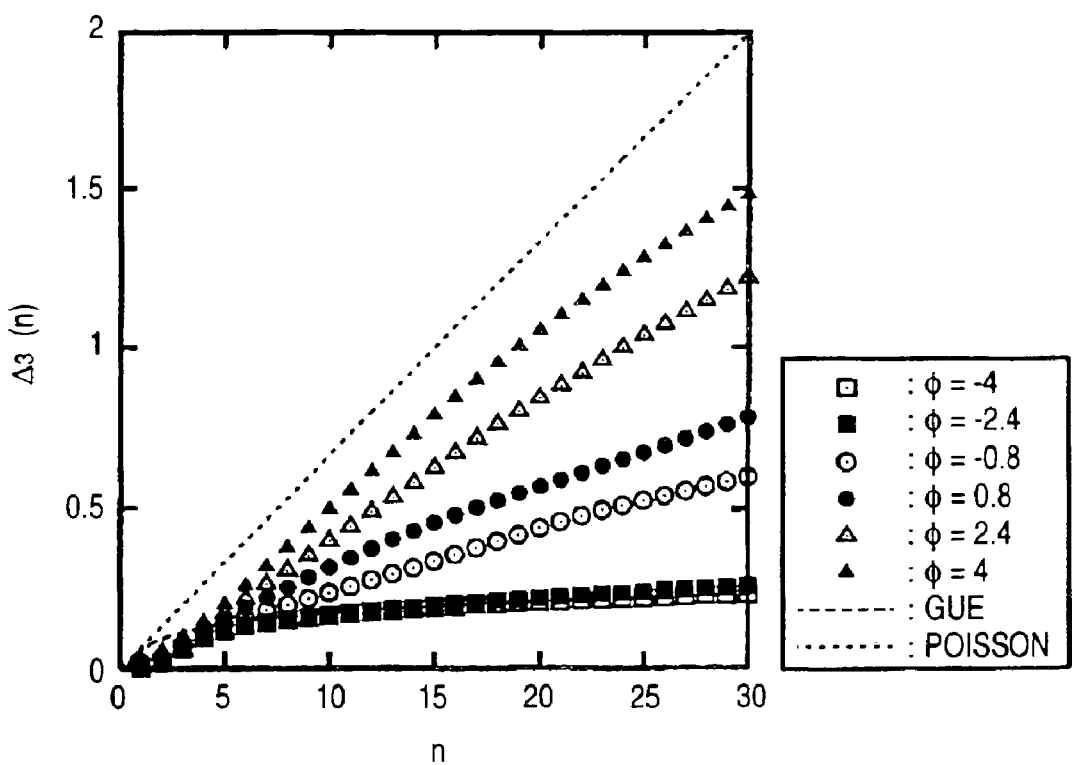
FIG. 13 is a schematic diagram showing results obtained by a simulation according to the second embodiment of the invention.

Shown in FIG. 12 is a nearest level spacing distribution P(s), and shown in FIG. 13 is Δ3 statistics. The values used for $\phi$ are −4, −2.4, −0.8, 0.8, 2.4, and 4. When $\phi$ is −4, electrons with large amplitude are present in the first layer having lower potential energy. In this case, the electrons are in the quantum chaos state which is well described by the GUE distribution. Along with the increase in $\phi$, amplitude in the second layer, which has a violent scattering due to the random potential, is increased to change the quantum level statistics. When $\phi$=4, the electrons with large amplitude are present in the second layer having lower potential energy to cause the Anderson localization in accordance with the Poisson distribution which is integrable.

From the above analysis, it is apparent that the quantum chaos property of the quantum system is controlled owing to the changes in value of $\phi$, i.e., owing to the changes in intensity of the electric field penetrating the two layers.

Other parts of this embodiment are the same as those of the first embodiment.

As described above, according to the second embodiment, the heterojunction is formed by bonding the region having the electron system characterized by quantum chaos with the region having the electron system characterized by integrability and by adding the magnetic impurity for the introduction of random potential, and the electric field perpendicular to the junction surface is applied to the heterojunction to externally and extensively control the quantum chaos property of the electron system in the system formed of the regions in such simple manner. Further, it is possible to form the heterojunction simply by using a single material.

Third Embodiment:

An electron device which controls quantum chaos according to the third embodiment uses a heterojunction which is a junction system of a region having an electron system characterized by quantum chaos and a region having an electron system characterized by integrability, and a Fermi level of an electron system is used for the control on quantum chaos property in addition to the changes in electric field intensity in this case.

Constitution of this electron device which controls quantum chaos is the same as that of the electron device which controls quantum chaos of the first embodiment except that the Fermi level of the electron system is set to a predetermined value.

Quantum level statistics are calculated by the method described in the first embodiment. In the following calculations, L is set to 80 (L=80) and a periodic boundary condition is used for each of the layers. The total number of states is 12,800 (2L²=12,800). Intrinsic energy values are obtained by dinagonalization to calculate the quantum level statistics. In the following calculations, the quantum chaos property is controlled by fixing the values of $t_1$, $t_2$, $t_3$, $V_1$ and $V_2$, as follows: $t_1=t_2=1$; $t_3=0.5$; $V_1=2$; and $V_2=20$ as well as by adjusting the value of $\phi$.

Figure 14:
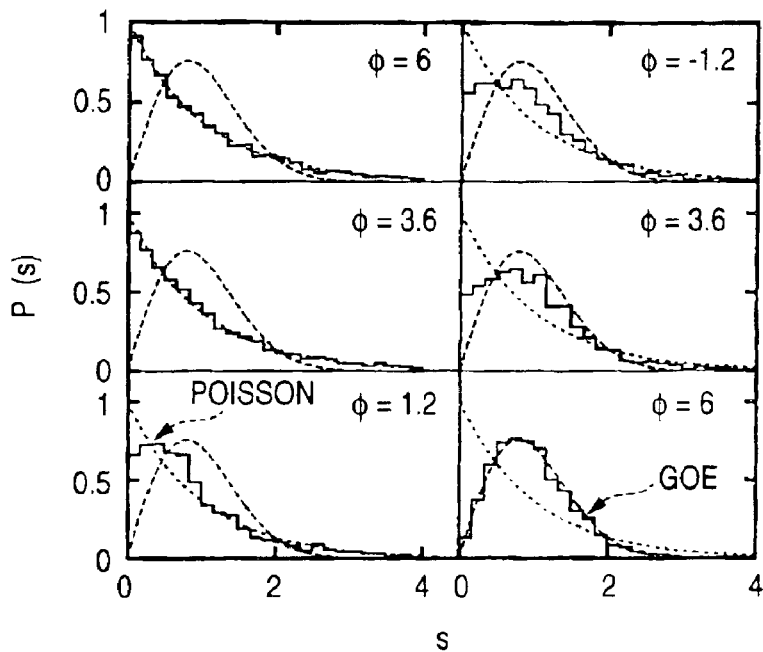
FIG. 14 is a schematic diagram showing results obtained by a simulation according to a third embodiment of the invention.
Figure 15:
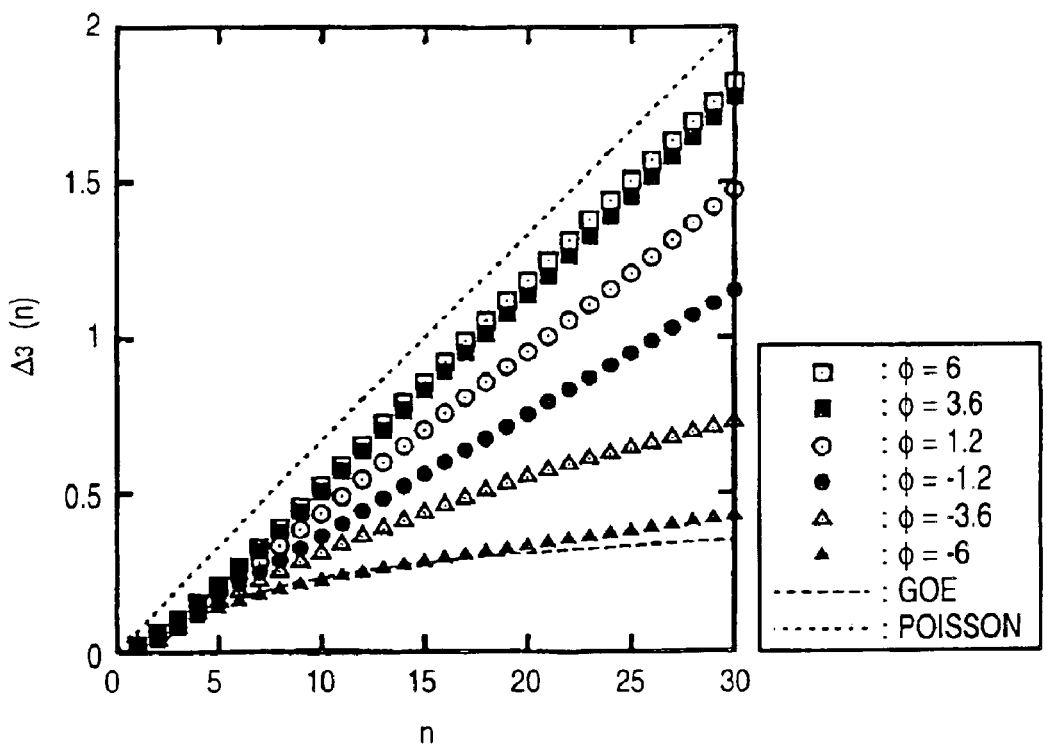
FIG. 15 is a schematic diagram showing results obtained by a simulation according to the third embodiment of the invention.

The quantum levels of from n=201 to n=3,200 are used. Shown in FIG. 14 is a nearest level spacing distribution P(s), and shown in FIG. 15 is Δ3 statistics. The values used for $\phi$ are −6, −3.6, −1.2, 1.2, 3.6, and 6. When $\phi$=6, electrons with large amplitude are present in the second layer having lower potential energy to cause the Anderson localization in accordance with the Poisson distribution which is integrable. Along with the decrease in $\phi$, amplitude in the first layer with relatively weak scattering which is caused by the random potential is increased to change the quantum level statistics. When $\phi$=−6, the first layer is in a metallic quantum chaos state which is well described by the GOE distribution.

From the above analysis, it is apparent that the quantum chaos property of the quantum system is controlled by the changes in $\phi$, i.e., the changes in intensity of the electric field penetrating the two layers.

In order to quantitatively investigate the modulation in quantum chaos property, the Berry-Robnik parameter ρ is introduced (Non-Patent Literature 14). When $\bar{\rho}=1-\rho$, the following equation:

$$P_2(s,\rho) = \rho^2 e^{-\rho s} erf\left(\frac{\sqrt{\pi}\,\bar{\rho} s}{2}\right) + \left(2\rho\bar{\rho} + \frac{\pi\bar{\rho}^3 s}{2}\right) e^{-\rho s - \pi\bar{\rho}^2 s^2/4} \quad (39)$$

is introduced. In the equation (39), the following equation:

$$erf(x) = \frac{2}{\sqrt{\pi}} \int_x^\infty d\tau\, e^{-\tau^2} \quad (40)$$

is used. The function $P_2(s,p)$ coincides with P(s) of the Poisson distribution when p=1 and coincides with P(s) of the GOE distribution when p=0. That is to say, it is possible to interpolate the quantum level statistics from the quantum chaos system to the integrable system by changing the value of p from 0 to 1. The Berry-Robnik parameter is the value of p when P(s) which is obtained by the mathematical calculation is approximated by using $P_2(s,p)$ In the scope of the semi-classical approximation, p is a volume ratio of a regular region (a region including the integrable system and a region generated by subjecting the integrable system to a perturbation expansion) in a phase space (Non-Patent Literature 15). Therefore, in the Anderson localization system discussed herein, p is regarded as a volume ratio of the localization state.

Figure 16:
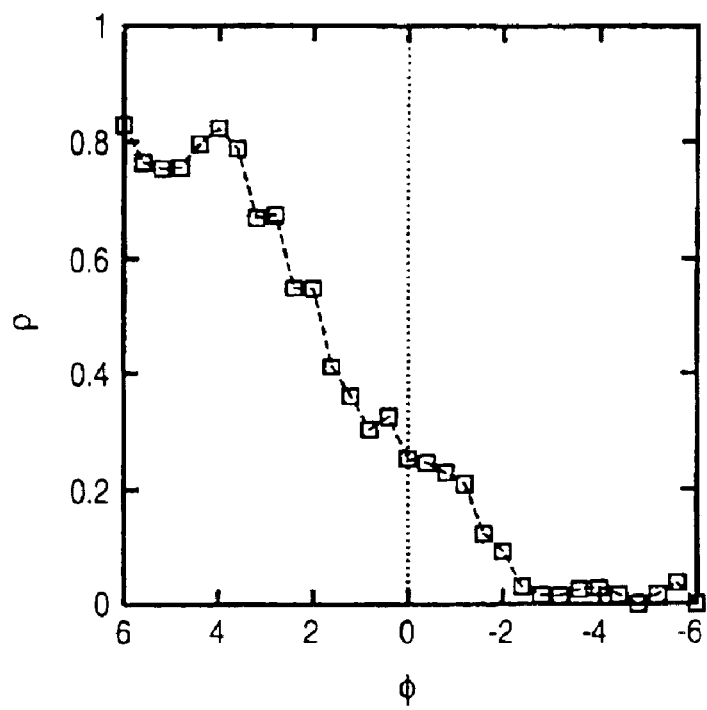
FIG. 16 is a schematic diagram showing results obtained by a simulation according to the third embodiment of the invention.

Shown in FIG. 16 is the Berry-Robnik parameter in the above-described system. The Berry-Robnik parameter is increased in value in the region where $\phi$ is large to indicate that a degree of the localization is great. The Berry-Robnik parameter value is reduced with the reduction in $\phi$ and reaches about 0 when $\phi$ is −2, thereby indicating that the system has the quantum chaos property.

These data reveal average characteristics relating to the wide energy region of from n=201 to n=3,200.

Figure 17:
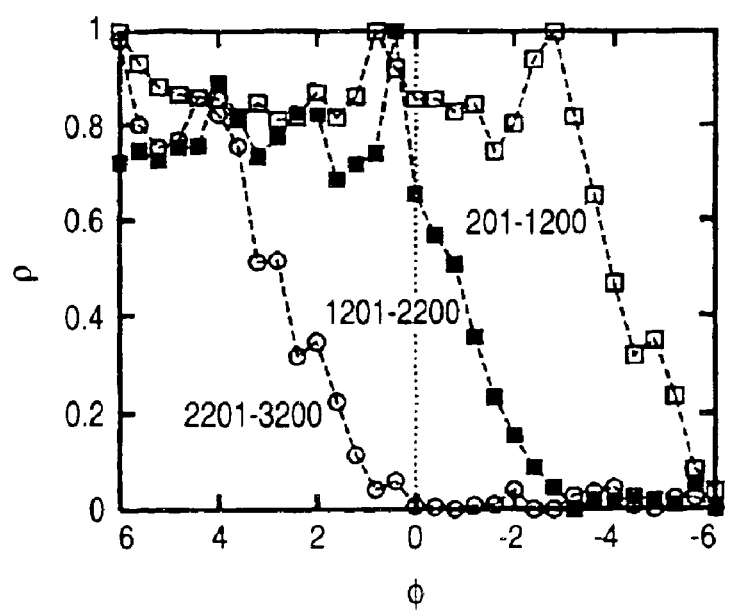
FIG. 17 is a schematic diagram showing results obtained by a simulation according to the third embodiment of the invention.

In order to control the quantum chaos by setting the Fermi level of the electron system to a predetermined value, it is necessary to study energy dependence of the quantum level statistics. Shown in FIG. 17 are Berry-Robnik parameters obtained by calculating the quantum level statistics using 1,000 states of from n=201 to n=1,200; the Berry-Robnik parameters obtained by the calculation using 1,000 states of from n=1,201 to n=2,200; and the Berry-Robnik parameters obtained by the calculation using 1,000 states of from n=2,201 to n=3,200. As is apparent from the three examples, in the case of the analysis of the relatively low energy state of 201 to 1,200, the obtained Berry-Robnik parameters are increased in value when the value of $\phi$ is relatively small to show the quantum localization property. The value of $\phi$ at which the Anderson transition occurs is larger in the energy state of 1,201 to 2,200, and this tendency is more conspicuous in the energy state of 2,201 to 3,200.

When the above results are applied to the electron system, a response of the electron system when the Fermi level of the electron system of the system is positioned at a point between n=201 and n=1,200 by controlling a voltage to be applied between the electrodes is well described by the data of from 201 to 1,200 shown in FIG. 17. Also, a response of the electron system when the Fermi level of the electron system of the system is positioned at a point between n=1,201 and n=2,200 is well described by the data of from 1,201 to 2,200 shown in FIG. 17. Further, a response of the electron system when the Fermi level of the electron system of the system is positioned at a point between n=2,201 and n=3,200 is well described by the data of from 2,201 to 3,200 shown in FIG. 17. Thus, the tendency toward localization is greater in the low energy state, and it is apparent that the critical potential with which the Anderson transition occurs due to the electric field effect, i.e. the electric field intensity, is controlled by controlling the Fermi level of the electron system.

Other parts of this embodiment are the same as those of the first embodiment.

As described in the foregoing, according to the third embodiment, the heterojunction is formed by bonding the region having the electron system characterized by quantum chaos with the region having the electron system characterized by integrability, and the Fermi level of the electron system of the system formed of the regions is set to a predetermined value by controlling the density of the electron system in addition to the application of the electric field perpendicular to the junction surface to the heterojunction, thereby externally and extensively controlling the quantum chaos property of the electron system in the system in such simple manner. Further, it is possible to form the heterojunction simply by using a single material.

Fourth Embodiment:

An electron device which controls quantum chaos according to the fourth embodiment uses a heterojunction which is a junction system of a region having an electron system characterized by quantum chaos and a region having an electron system characterized by integrability, and a transfer between the regions is set to a value smaller than that of each of the regions in this case to cause the Anderson transition accompanying quantum chaos to occur rapidly.

Constitution of the electron device which controls quantum chaos is the same as that of the electron device which controls quantum chaos of the first embodiment except that the transfers are set in the above described manner.

Figure 18:
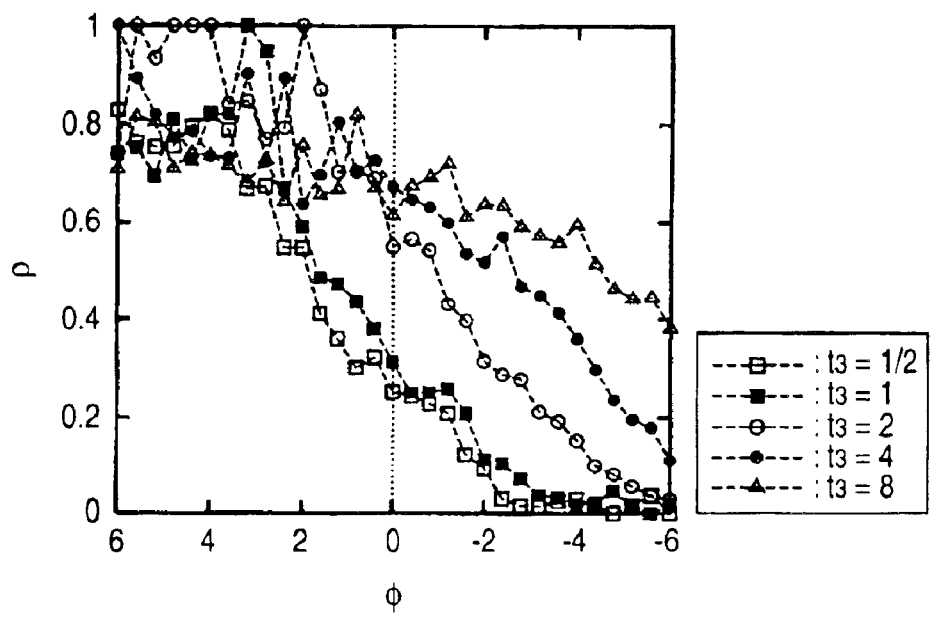
FIG. 18 is a schematic diagram showing results obtained by a simulation according to a fourth embodiment of the invention.
Figure 19:
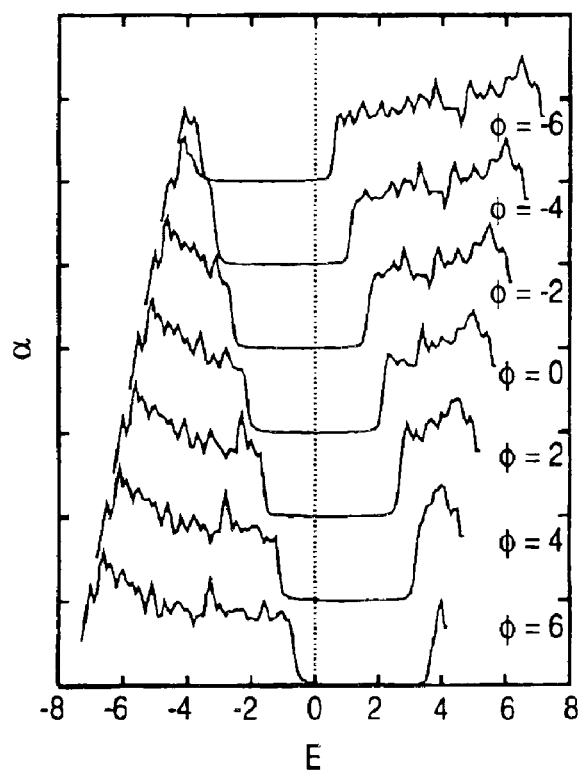
FIG. 19 is a schematic diagram showing results obtained by a simulation according to the fourth embodiment of the invention.
Figure 20:
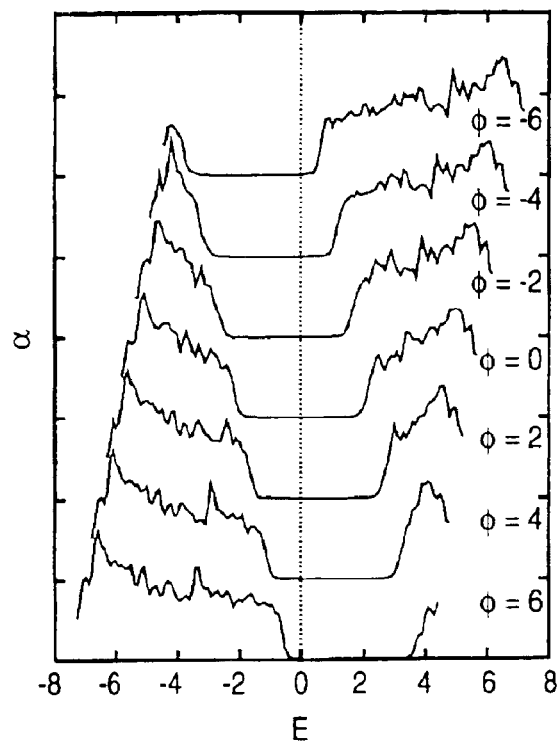
FIG. 20 is a schematic diagram showing results obtained by a simulation according to the fourth embodiment of the invention.
Figure 21:
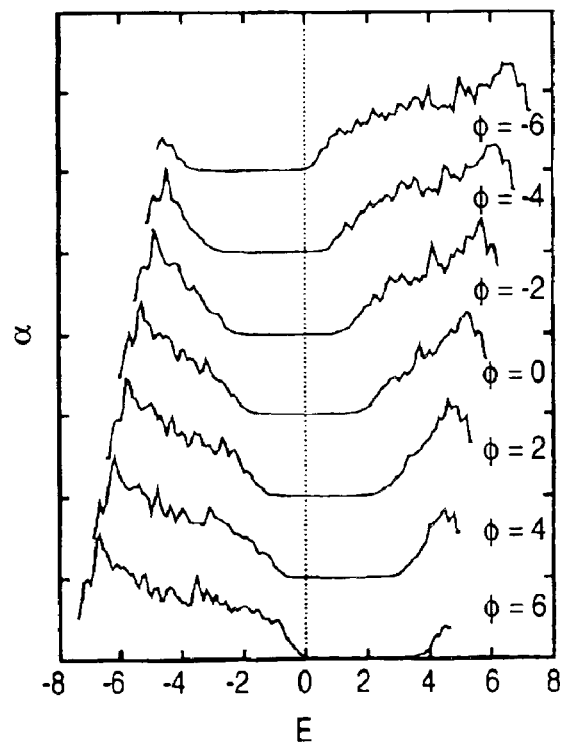
FIG. 21 is a schematic diagram showing results obtained by a simulation according to the fourth embodiment of the invention.
Figure 22:
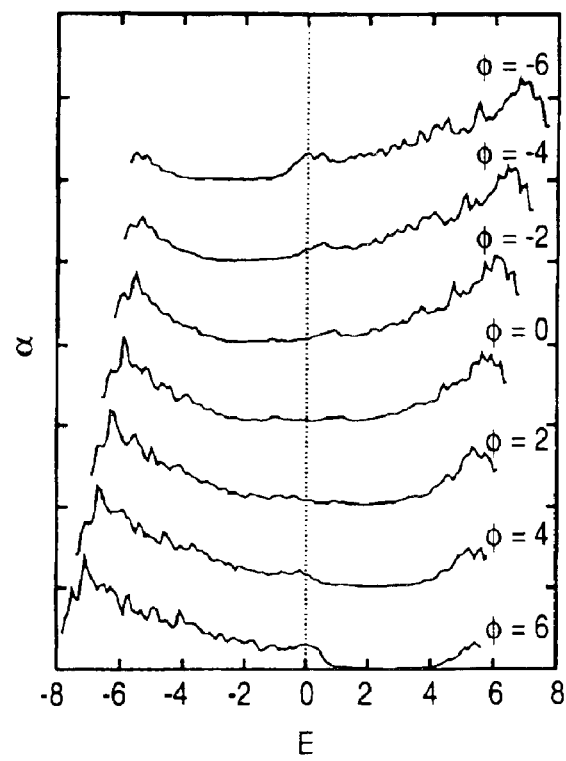
FIG. 22 is a schematic diagram showing results obtained by a simulation according to the fourth embodiment of the invention.
Figure 23:
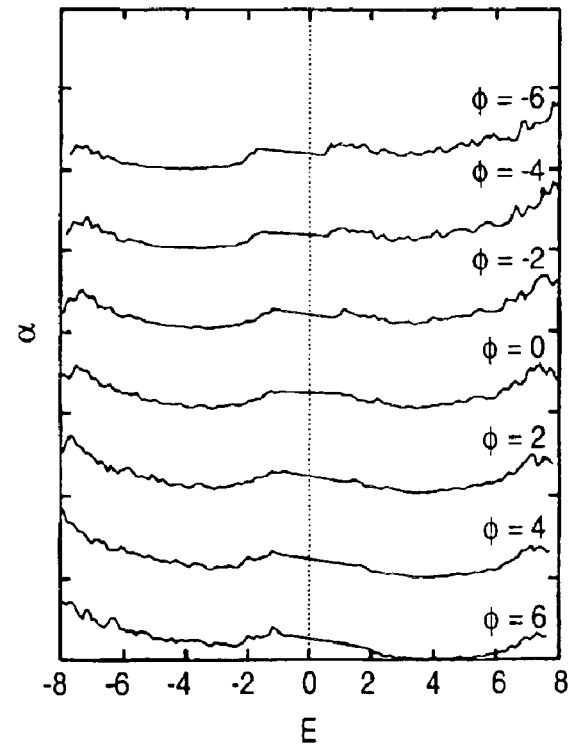
FIG. 23 is a schematic diagram showing results obtained by a simulation according to the fourth embodiment of the invention.

Quantum level statistics are calculated by the method described in the first embodiment, and Berry-Robnik parameter ρ is introduced in order to quantitatively investigate the modulation in quantum chaos property. In the following mathematical calculations, L is set to 80 (L=80) and a periodic boundary condition is used for each of the layers. The total number of states is 12,800 (2L²=12,800). Intrinsic energy values are obtained by dinagonalization to calculate the quantum level statistics. In the following calculations, the quantum chaos property are controlled by fixing the values of $t_1$, $t_2$, $t_3$, $V_1$, and $V_2$ as follows: $t_1=t_2=1$; $t_3=\frac{1}{2}$, 1, 2, 4, and 8; $V_1=2$; and $V_2=20$ as well as by adjusting the value of $\phi$. The quantum levels of from n=1,201 to n=3,200 are used. Shown in FIG. 18 is the Berry-Robnik parameter. Referring to FIG. 18, in the case of $t_3=\frac{1}{2}$, the obtained Berry-Robnik parameter is large at a region where $\phi$ is large to show the great localization property. The Berry-Robnik parameter is reduced with the reduction in $\phi$ and ρ reaches about 0 when $\phi=-2$ where system shows the quantum chaos property. With the increase in $t_3$, the modulation is reduced. Particularly, when $t_3=4$ or more, the function for $\phi$ changes to be more linear.

The Anderson transition in an infinite system will hereinafter be reviewed. In a pure two-dimensional system, all single electron quantum states are localized at the absolute zero so that the system always behaves as an insulator unless intensity of the random potential is zero no matter how weak the intensity is. Conductivity occurs at a finite temperature since the coherence length is infinite at the finite temperature; however, it is known that correction item of conductivity by quantum phase interference effect in a region having a weak random potential (weak localization region) does not depend on the random potential intensity. In terms of the system of this embodiment, when $t_3$ is sufficiently large, the bonding state and the antibonding state of the first layer and the second layer are sufficiently separated. In this case, the bonding state when the Fermi level is positioned at the bonding state, for example, is considered to be the pure two-dimensional quantum limit. The random potential intensity is modulated by the electric field effect, but it is assumed from the above discussion that the modulation has less influence on the electron state. The quantum states of the first layer and the second layer are mixed with each other along with the reduction in $t_3$ so that the pure two-dimensional system is lost, thereby causing rapid metal/insulator phase transition. In this case, each of the values of $t_1$ and $t_2$ is 1. Therefore, a bandwidth of each of the layers is 4, and the rapid Anderson transition occurs when $t_3$ is sufficiently smaller than the bandwidth.

Analysis by the inverse participation ratio will hereinafter be explained.

The inverse participation ratio which has frequently been used in the analysis of Anderson transition is a quantity described as follows $$\alpha_m = \sum_r |\phi_m(r)|^4. \tag{41}$$

In the equation (41), $\phi m(r)$ is a wave function of the intrinsic energy $\epsilon_m$, and r represents a lattice point. More specifically, the fourth power of the wave function of the m-th energy intrinsic state is subjected to a space integration to obtain the inverse participation ratio. When the random potential intensity is spatially constant, the Anderson transition in the system is clarified by analyzing the quantity. The reasons for the above are briefly given below.

$$\phi_m(r) = \begin{cases} 1/\sqrt{\omega} & \text{when } r \in \Omega \\ 0 & \text{otherwise} \end{cases} \tag{42}$$

is considered as the wave function as a typical example of the localization state, whose volume is localized in a region $\Omega$ having a volume of $\omega$. In this case, the inverse participation ratio is $$\alpha_m = \int_\Omega dV \frac{1}{\omega^2} = \frac{1}{\omega}. \tag{43}$$

Therefore, the quantity is in inverse proportion to the localized volume and is asymptotic to zero in the metallic state.

The quantity will be calculated in this system as follows. In the calculation, L is set to 40 (L=40), and the total number of states is 3,200 (N=2×40²). Since $\alpha_m$ itself is distributed, it is convenient to analyze the quantity by defining the quantity as a quantity averaged in an energy window.

The following equation:

$$\alpha(E, W) = \frac{1}{\mu(E, W)} \sum_{m \in \Omega(E, W)} \alpha_m \quad (44)$$

is introduced. In the equation (44), $$\Omega(E, W) = \{m | E - W/2 < \epsilon_m < E + W/2\} \quad (45)$$

That is to say, the intrinsic energy value $\epsilon_m$ is in the rage of W with the center being E, and the number of states is written as $\mu(E, W)$. Here, the value used for W is 0.4.

The quantities in the cases where $t_3=\frac{1}{2}$, $t_3=1$, $t_3=2$, $t_3=4$, and $t_3=8$ are shown in FIGS. 19, 20, 21, 22, and 23. In these graphs, the values used for $\phi$ are −6, −4, −2, 0, 2, 4, and 6. The values for $\phi$ are indicated on each of the graphs as being shifted by 0.4 in the vertical direction. A region in which $\alpha(E, W)$ is almost zero is present in FIG. 19 where the rapid phase transition is observed, and the region shifts with $\phi$ to generate the metal/insulator phase transition. In the case where $t_3$ is large, the region in which $\alpha(E, W)$ is almost zero is absent, and tendency of being always localized is observed in all energy regions. This can be considered as an effect of the two-dimensional quantum limit.

Figure 24:
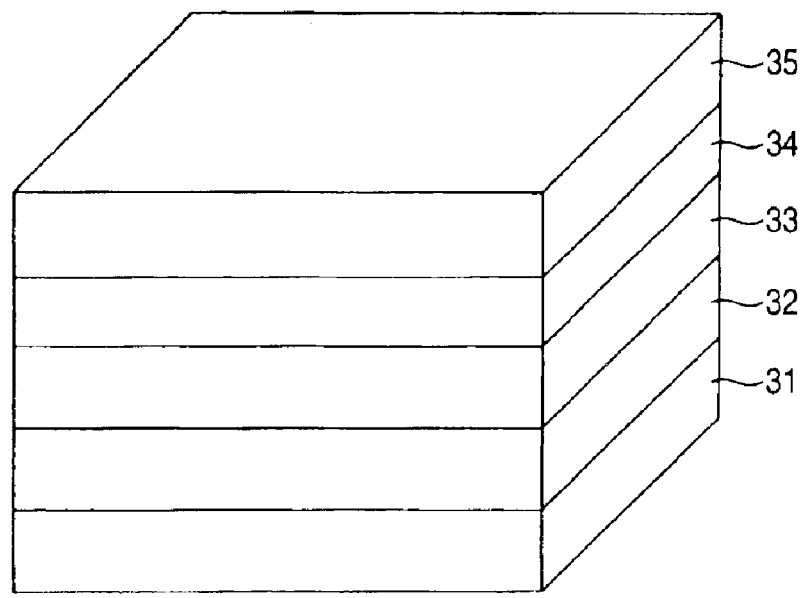
FIG. 24 is a perspective view showing a specific example of a structure of an electron device which controls quantum chaos according to the fourth embodiment of the invention.

A specific example of an electron device which controls quantum chaos as a physical system having a small $t_3$ is shown in FIG. 24.

Referring to FIG. 24, in the electron device which controls quantum chaos, an insulating layer 31 formed from undoped AlGaAs or the like, a localization layer 32 formed from GaAs or the like, a tunnel barrier 33 formed from undoped AlGaAs or the like, a conductive layer 34 formed from undoped AlGaAs or the like, and an insulating layer 35 formed from undoped AlGaAs or the like are stacked in this order to form a heterojunction of AlGaAs/GaAs/AlGaAs/AlGaAs/AlGaAs (in the order of from bottom to top). In the localization layer 32, a random potential is introduced by adding thereto impurity or introducing thereto a lattice defect, and the random potential is not introduced to other layers or, if introduced, the quantity is ignorable. The localization layer 32 may be an undoped layer when the random potential introduction is performed through the lattice defect introduction. The localization layer 32 shows Anderson localization, and the conductive layer 34 shows the metallic state. An Al composition of AlGaAs of the conductive layer 34 is selected in such a manner that energy at the bottom (lower end) of a conductive band of the conductive layer 34 is a little higher than that of the localization layer 32 and is sufficiently lower than those of the tunnel barrier 33 and the insulating layer 35. Electrodes (not shown) are formed on the insulating layer 35 and a bottom face of the insulating layer 31, and it is possible to apply an electric field in the z-axis direction by applying a voltage between the electrodes.

Figure 25:
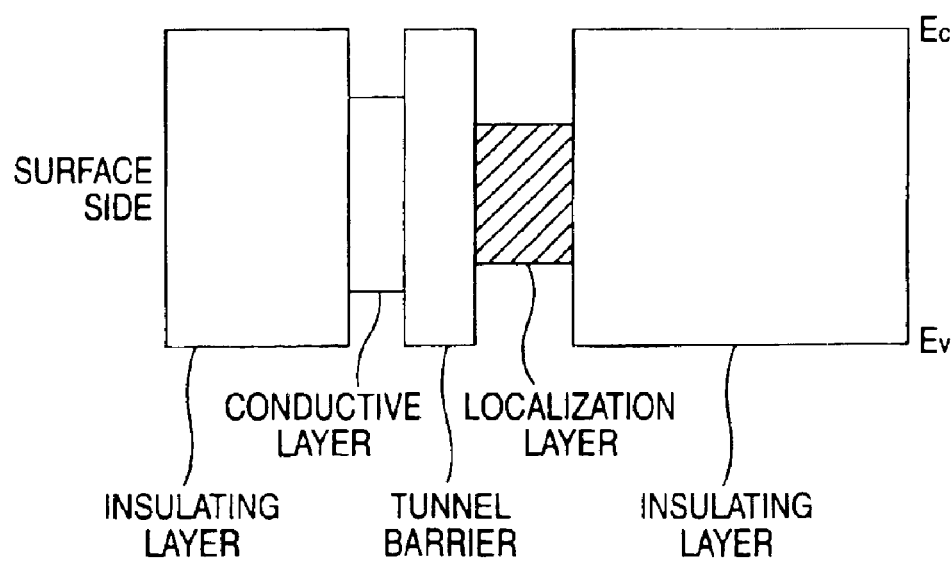
FIG. 25 is a diagram showing an energy band of the electron device which controls quantum chaos according to the fourth embodiment of the invention.

Shown in FIG. 25 is an energy band perpendicular to a hetero surface of the electron device which controls quantum chaos. Referring to FIG. 25, $E_c$ represents the energy at the bottom of the conductive band and $E_v$ represents energy on the top (upper end) of a valence band (the same applies to other diagrams).

As described in the foregoing, according to the fourth embodiment, the heterojunction is formed by bonding the region having the electron system characterized by quantum chaos with the region having the electron system characterized by integrability, and the transfer between the regions is set to a value smaller than the transfer of each of the regions, preferably set to a value small enough, thereby making it possible to externally and extensively control the quantum chaos property of the electron system formed of the regions and the Anderson transition in the system as well as to cause the Anderson transition rapidly by such simple manner of applying to the heterojunction an electric field perpendicular to the junction surface. Further, it is possible to form the heterojunction simply by using a single material.

Fifth Embodiment:

An electron device which controls quantum chaos according to the fifth embodiment is obtained by using a double heterojunction which is a junction system of a region having an electron system characterized by quantum chaos and regions each having an electron system characterized by integrability and being disposed on each sides of the region having the electron system characterized by quantum chaos.

Figure 26:
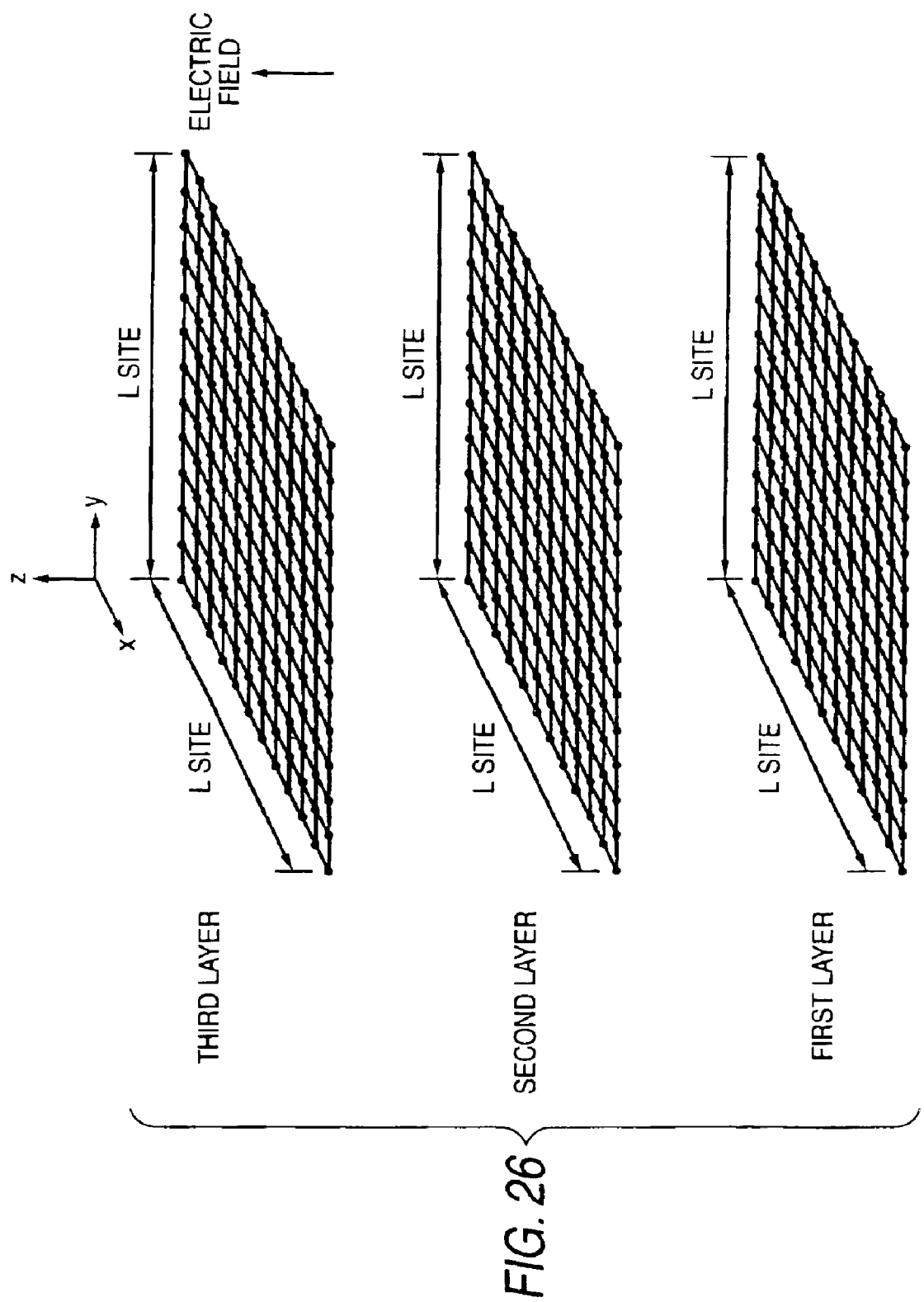
FIG. 26 is a schematic diagram showing a main part of an electron device which controls quantum chaos according to a fifth embodiment of the invention.

Shown in FIG. 26 are three layers of square lattice wherein each side is L site. The double heterojunction is formed of these three layers. A maximum dimension of the layers is smaller than an electron coherence length ($\sqrt{2}La$ when a distance between adjacent lattice points is a). An operator $\hat{c}_p^\dagger$ for generating quantum is defined on a p-th lattice point of the first layer. An operator $\hat{d}_p^\dagger$ for generating quantum is defined on a p-th lattice point of the second layer. An operator $\hat{e}_p^\dagger$ for generating quantum is defined on a p-th lattice point of the third layer. Here, Hamiltonian $\hat{H}$ of the quantum system is defined by the following equation:

$$\hat{H} = -t_1 \sum_{(p,q)} \hat{c}_p^\dagger \hat{c}_q - t_2 \sum_{(p,q)} \hat{d}_p^\dagger \hat{d}_q - t_3 \sum_{(p,q)} \hat{e}_p^\dagger \hat{e}_q - \quad (46)$$

$$t_{12} \sum_p \hat{c}_p^\dagger \hat{d}_p - t_{23} \sum_p \hat{d}_p^\dagger \hat{e}_p + \sum_p u_p \hat{c}_p^\dagger \hat{c}_p +$$

$$\sum_p v_p \hat{d}_p^\dagger \hat{d}_p + \sum_p w_p \hat{e}_p^\dagger \hat{e}_p + \frac{\phi}{2} \sum_p \left( \hat{e}_p^\dagger \hat{e}_p - \hat{c}_p^\dagger \hat{c}_p \right) + H.C.$$

In the equation (46), <p, q> means nearest sites in each of the layers; $t_1$ represents the transfer of the first layer; $t_2$ represents the transfer of the second layer; $t_3$ represents the transfer of the third layer; $t_{12}$ represents the transfer between the first layer and the second layer; and $t_{23}$ represents the transfer between the second layer and the third layer. A random potential of the first layer is introduced by $u_p$. Here, $u_p$ is a random variable generated by:

$$-V_1/2 < u_p < V_1/2 \quad (47).$$

A random potential of the second layer is introduced by $v_p$. Here, $v_p$ is a random variable generated by:

$$-V_2/2 < v_p < V_2/2 \quad (48).$$

A random potential of the third layer is introduced by $w_p$. Here, $w_p$ is a random variable generated by:

$$-V_3/2 < w_p < V_3/2 \quad (49).$$

It is possible to introduce the random potentials by, for example, adding impurity or introducing a lattice defect.

When $t_{12}=0$, the first layer and the second layer are separated from each other. When $t_{23}=0$, the second layer and the third layer are separated from each other. In the case where the three layers are separated from one another, the j-th layer is in the metallic Fermi liquid state when $V_j/t_j$ is sufficiently small. On the other hand, in the case where the quantity is sufficiently large, the Anderson localization occurs so that the system is in the insulation state.

When $t_{12}>0$ and $t_{23}>0$, the three layers form a quantum junction. An average potential difference $\phi$ of the first and the third layers is introduced, and this parameter is proportion to the electric field penetrating the three layers. Changes in the quantum state of the system using $\phi$ as the parameter are important.

An inverse participation ratio is calculated in the same manner as in the fourth embodiment. In the calculation, L is set to 40 (L=40), and the total number of states is 4,800 (N=3×40$^2$). Since the number of states $\mu(E, W)$ is in proportion to the density of states, the following equation:

$$D(E,W)=\mu(E,W)/\mu_{max} \qquad (50)$$

is introduced. For the purpose of standardization, the following equation:

$$\mu_{max} = \max_E \mu(E, W) \qquad (51)$$

is introduced. The following calculations are conducted by using 0.4 as the value of W.

In the following mathematical calculations, a periodic boundary condition is used for each of the layers. Intrinsic energy values and intrinsic functions are obtained by the dinagonalization, and $\alpha(E,W)$ and $D(E,W)$ are calculated. In the following calculations, definitions of $t_1=t_2=t_3=1$ and $t_{12}=t_{23}=0.5$ are used.

Figure 27:
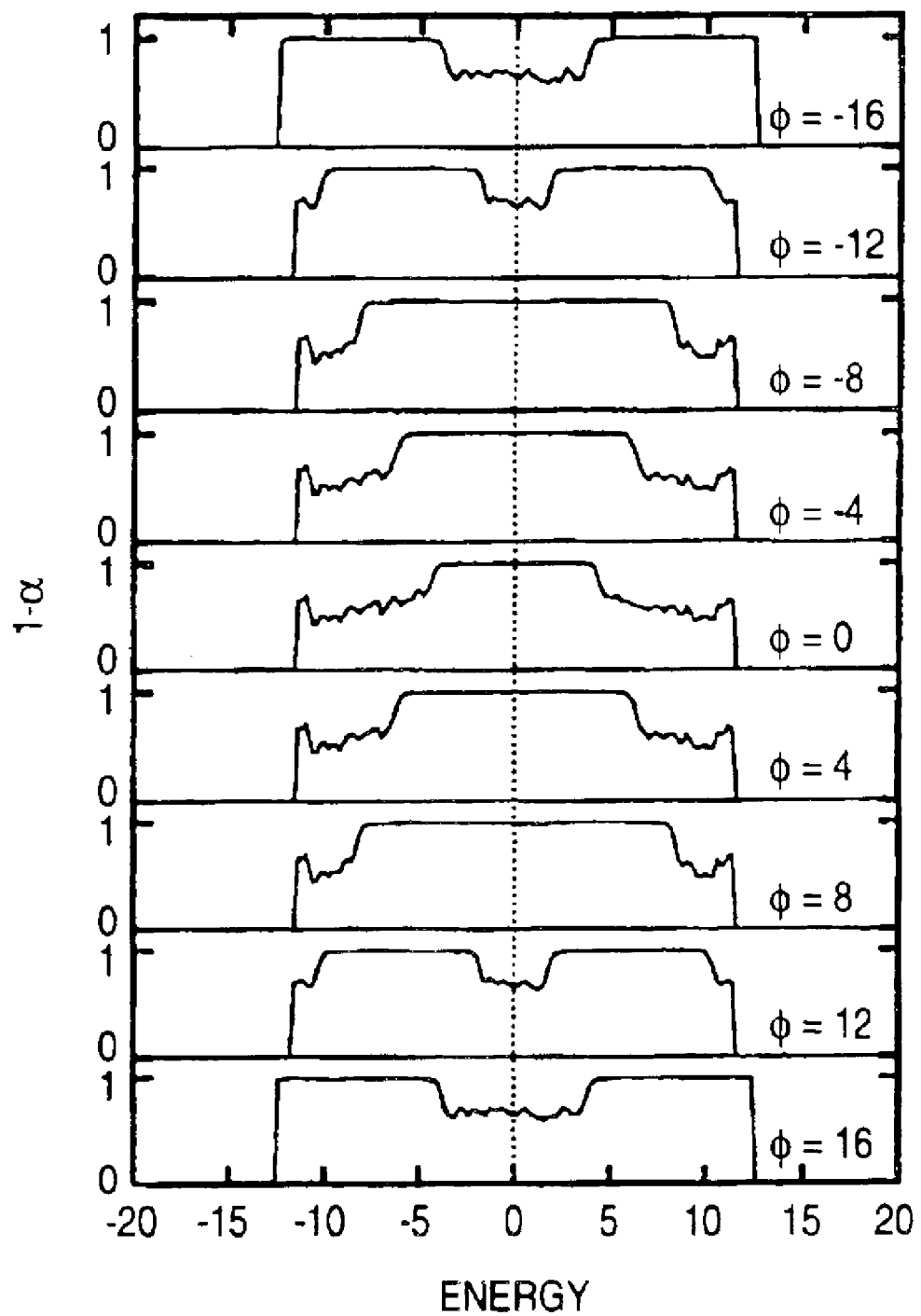
FIG. 27 is a schematic diagram showing results obtained by a simulation according to the fifth embodiment of the invention.
Figure 28:
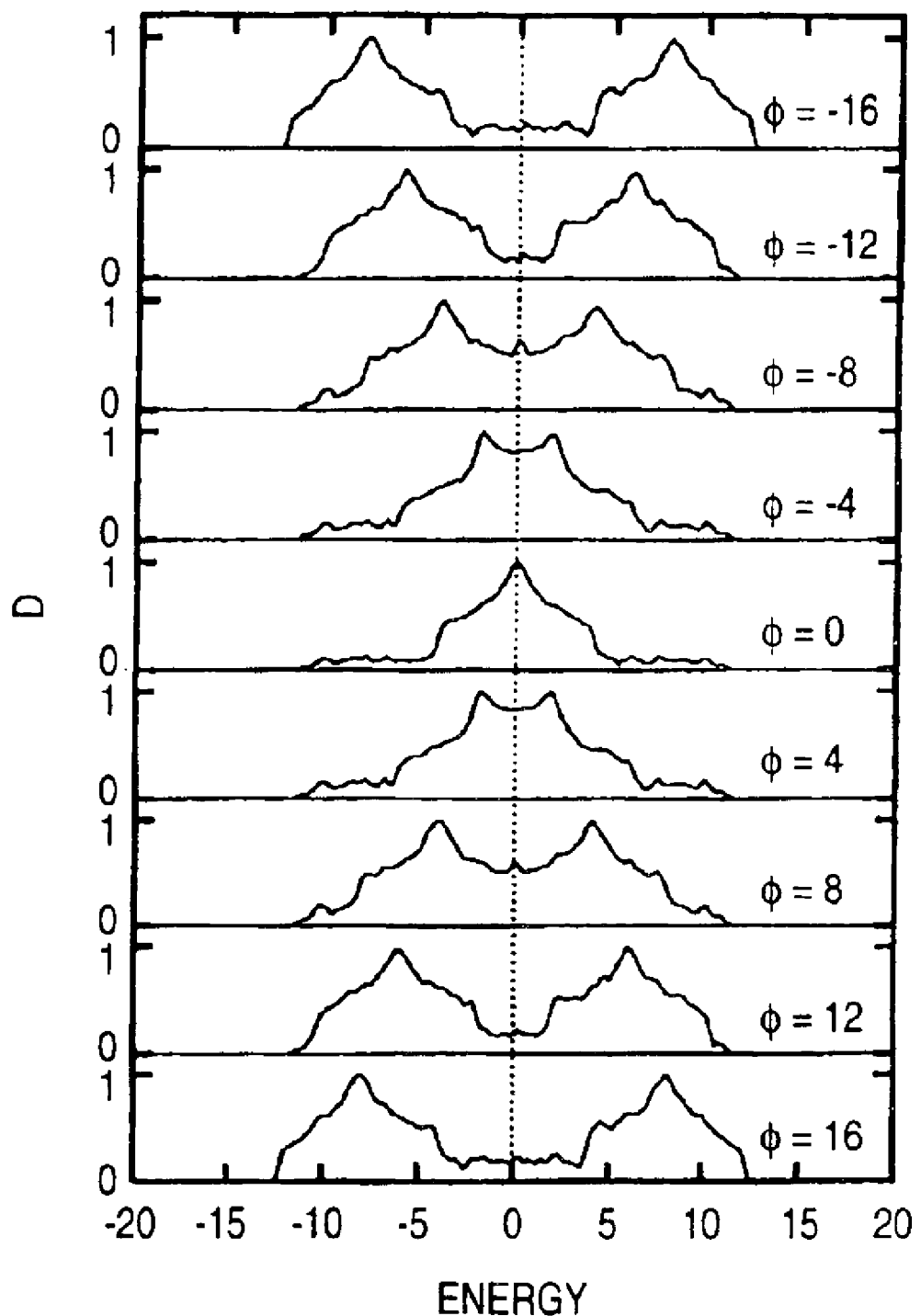
FIG. 28 is a schematic diagram showing results obtained by a simulation according to the fifth embodiment of the invention.

The cases of $1-\alpha(E, W)$ and $D(E, W)$ when $V_1=2$, $V_2=20$, and $V_3=2$ are shown in FIGS. 27 and 28. Values used for $\phi$ are −16, −12, −8, −4, 0, 4, 8, 12, and 16 in the figures. The system has the three layer structure of conductive layer/localization layer/conductive layer. The layers are indicated as being shifted by 1.2 in the vertical direction. As is apparent form FIG. 27, a region in which $1-\alpha(E, W)$=about 1 is present. In this region, the metallic quantum state is observed. A rapid metal/insulator phase transition occurs when the region moves with $\phi$. Referring to FIG. 28, in the energy region where the metallic quantum state is observed, the value of $D(E,W)$ is large. In the double heterotic structure, the metallic state appears on two points. Therefore, it is clarified that the three layer structure enables the quantum state control in the more extensive electron system.

Figure 29:
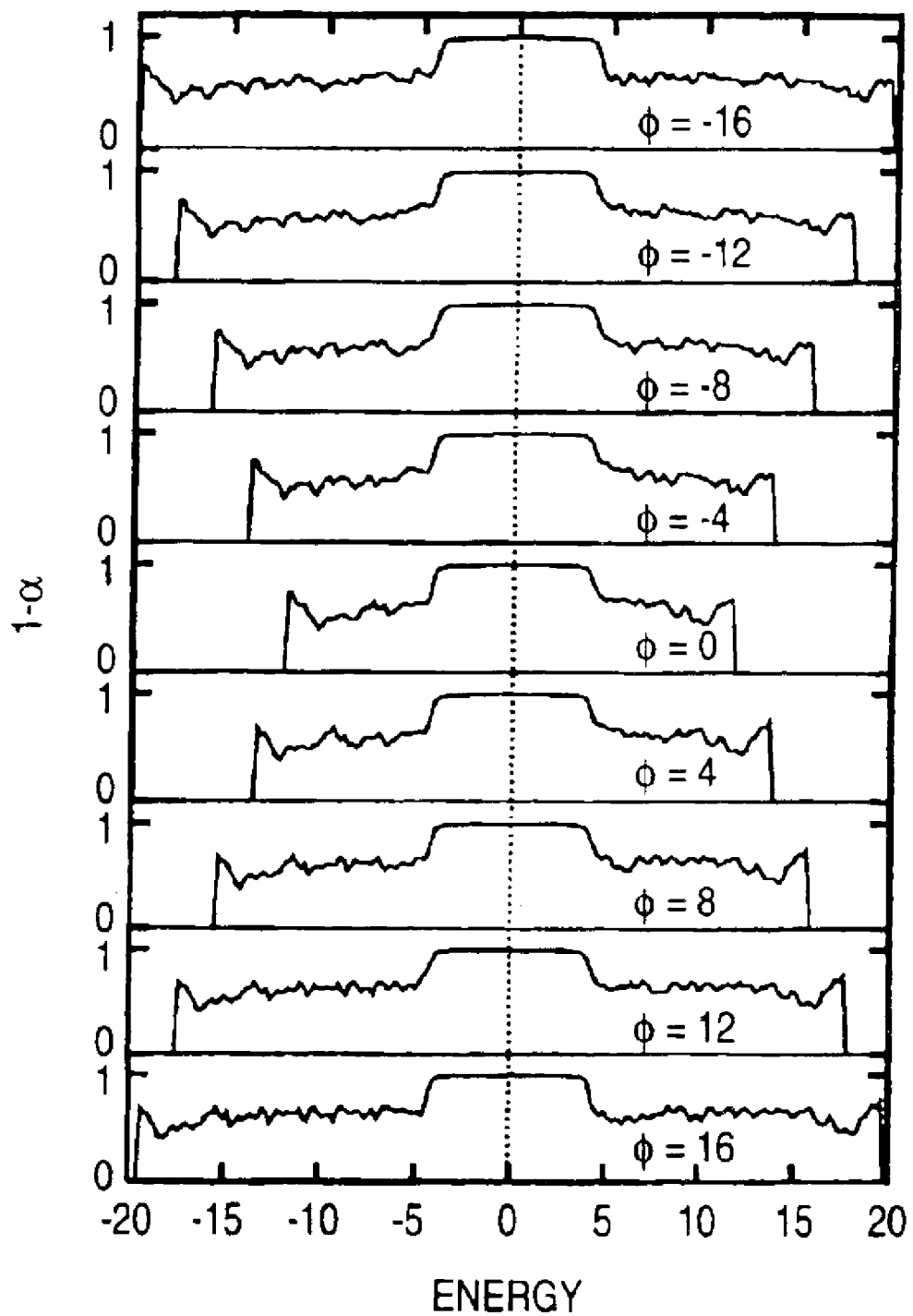
FIG. 29 is a schematic diagram showing results obtained by a simulation according to the fifth embodiment of the invention.
Figure 30:
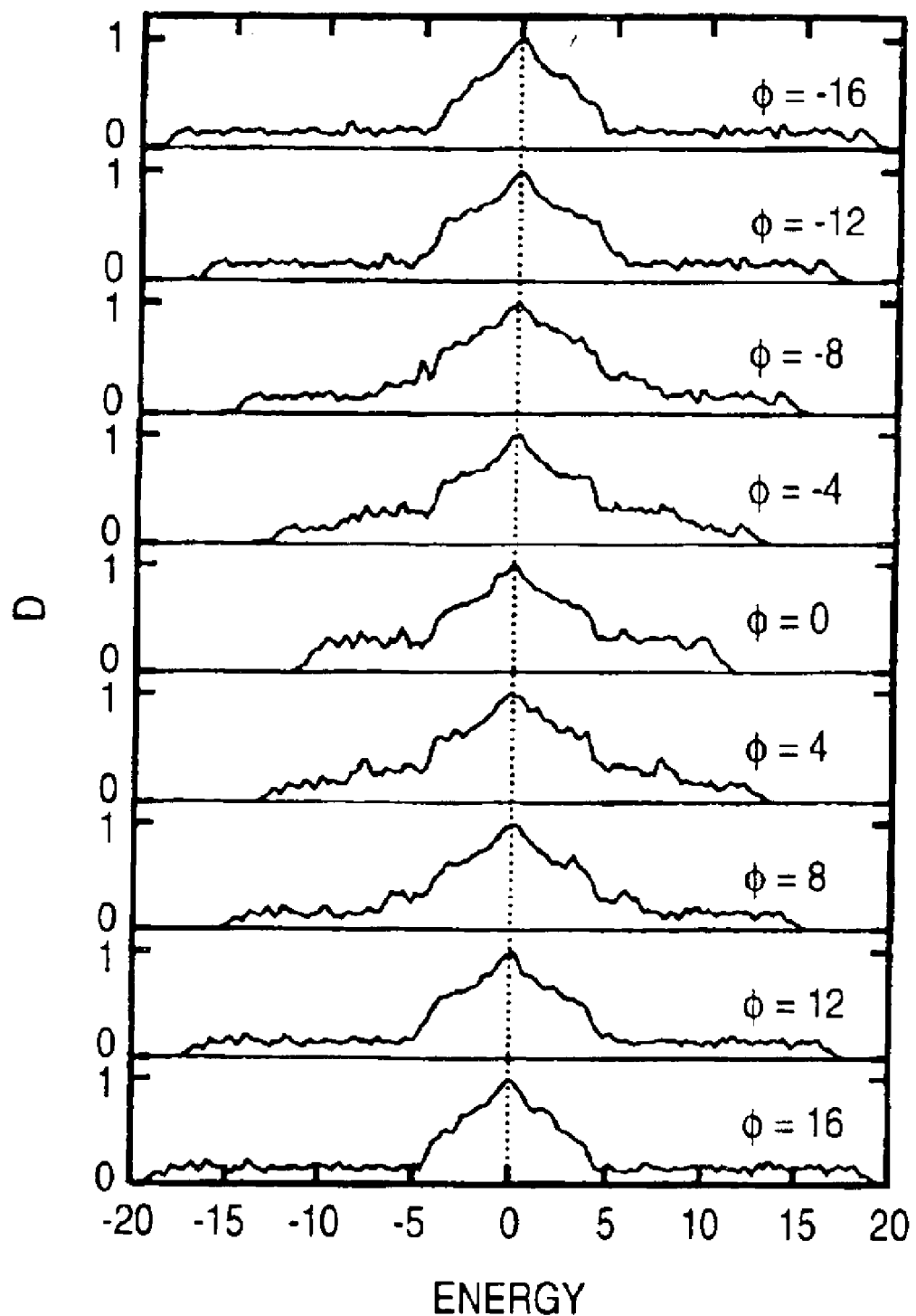
FIG. 30 is a schematic diagram showing results obtained by a simulation according to the fifth embodiment of the invention.

The cases of $1-\alpha(E, W)$ and $D(E, W)$ when $V_1=20$, $V_2=2$, and $V_3=20$ are shown in FIGS. 29 and 30 as complementary. In these cases, the system has a three-layer structure of localization layer/conductive layer/localization layer. The energy region in which $1-\alpha(E, W)$ becomes substantially 1, i.e. the metallic quantum state, is present in the band center. This region does not depend on $\phi$ since the conductive layer which takes the important roll in the metallic quantum state is positioned on the center to be free from the influence of $\phi$.

Figure 31:
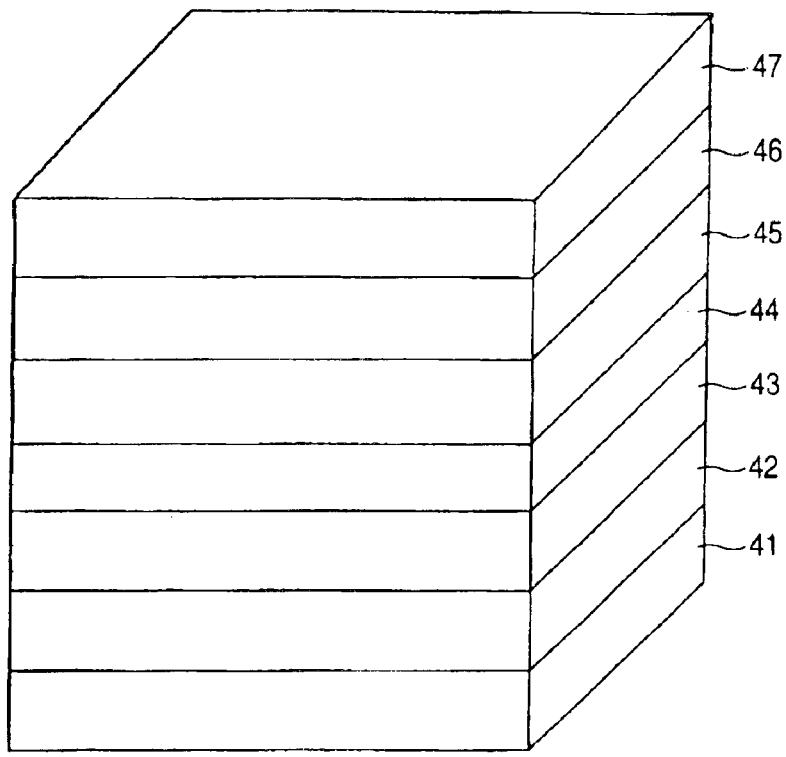
FIG. 31 is a sectional view showing a specific example of a structure of an electron device which controls quantum chaos according to the fifth embodiment of the invention.

A specific example of an electron device which controls quantum chaos having the above-described three layer structure of conductive layer/localization layer/conductive layer is shown in FIG. 31.

As shown in FIG. 31, in the electron device which controls quantum chaos, an insulating layer 41 formed from undoped AlGaAs or the like, a conductive layer 42 formed from undoped AlGaAs or the like, a tunnel barrier 43 formed from undoped AlGaAs or the like, a localization layer 44 formed from InGaAs or the like, a tunnel barrier 45 formed from undoped AlGaAs or the like, a conductive layer 46 formed from undoped AlGaAs or the like, and an insulating layer 47 formed from undoped AlGaAs or the like are stacked in this order to form a heterojunction of AlGaAs/AlGaAs/AlGaAs/InGaAs/AlGaAs/AlGaAs/AlGaAs (in the order of from bottom to top). In the localization layer 44, a random potential is introduced by adding thereto impurity or introducing thereto a lattice defect, and the random potential is not introduced to other layers or, if introduced, the quantity is ignorable. The localization layer 44 may be an undoped layer when the random potential introduction is performed through the lattice defect introduction. The localization layer 44 shows the Anderson localization, and the conductive layers 42 and 46 show the metallic state. An Al composition of AlGaAs of each of the conductive layers 42 and 46 is selected in such a manner that energy at the bottom (lower end) of a conductive band of each of the conductive layers 42 and 46 is sufficiently lower than those of the tunnel barriers 43 and 45 and the insulating layers 41 and 47. Electrodes (not shown) are formed on the insulating layer 47 and a bottom face of the insulating layer 41, and it is possible to apply an electric field in the z-axis direction by applying a voltage between the electrodes.

Figure 32:
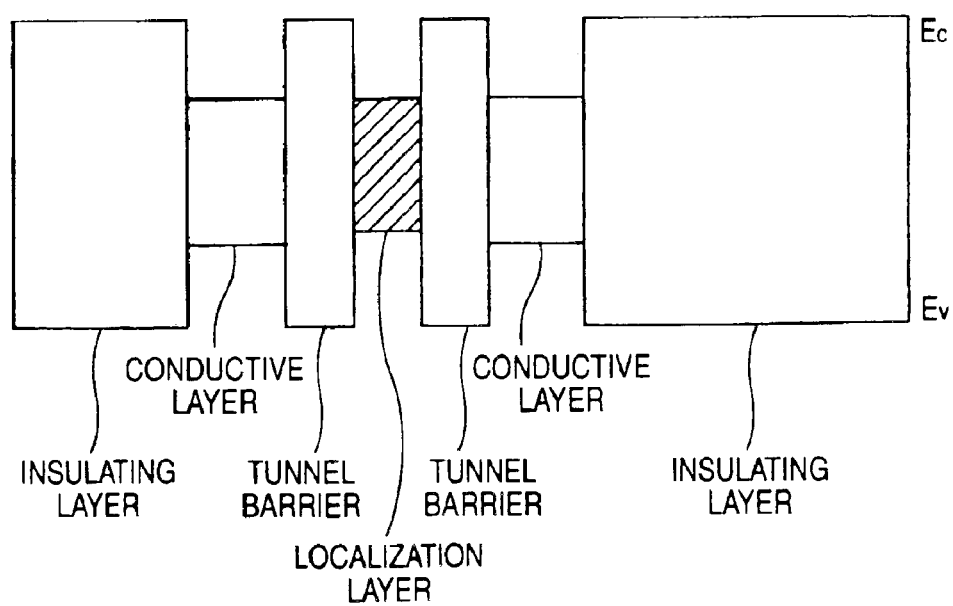
FIG. 32 is a diagram showing an energy band of the electron device which controls quantum chaos according to the fifth embodiment of the invention.

Shown in FIG. 32 is an energy band perpendicular to a hetero surface of the electron device which controls quantum chaos.

Figure 33:
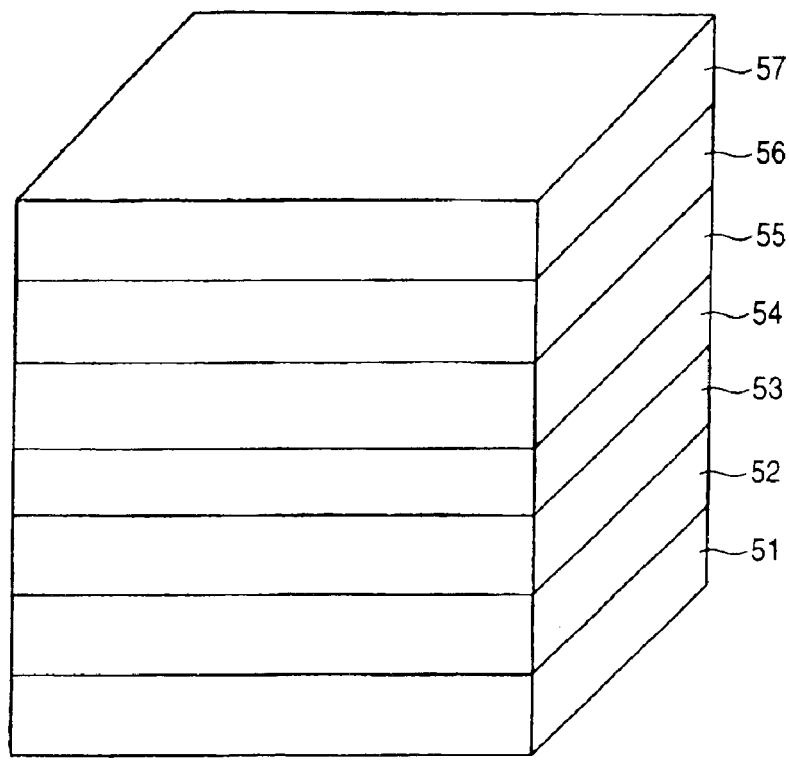
FIG. 33 is a sectional view showing a specific example of a structure of an electron device which controls quantum chaos having a three layer structure of localized layer/conductive layer/localized layer.

A specific example of an electron device which controls quantum chaos having the above-described three layer structure of localization layer/conductive layer/localization layer is shown in FIG. 33.

As shown in FIG. 33, in the electron device which controls quantum chaos, an insulating layer 51 formed from undoped AlGaAs or the like, a localization layer 52 formed from InGaAs or the like, a tunnel barrier 53 formed from undoped AlGaAs or the like, a conductive layer 54 formed from undoped AlGaAs or the like, a tunnel barrier 55 formed from undoped AlGaAs or the like, a localization layer 56 formed from InGaAs or the like, and an insulating layer 57 formed from undoped AlGaAs or the like are stacked in this order to form a heterojunction of AlGaAs/InGaAs/AlGaAs/AlGaAs/AlGaAs/InGaAs/AlGaAs (in the order of from bottom to top). In each of the localization layers 52 and 56, a random potential is introduced by adding thereto impurity or introducing thereto a lattice defect, and the random potential is not introduced to other layers or, if introduced, the quantity is ignorable. The localization layers 52 and 56 may be undoped layers when the random potential introduction is performed through the lattice defect introduction. The localization layers 52 and 56 show the Anderson localization, and the conductive layer 54 shows the metallic state. An Al composition of AlGaAs of the conductive layer 54 is selected in such a manner energy at the bottom (lower end) of a conductive band of the conductive layer 54 is sufficiently lower than those of the tunnel barriers 53 and 55 and the insulating layers 51 and 57. Electrodes (not shown) are formed on the insulating layer 57 and a bottom face of the insulating layer 51, and it is possible to apply an electric field in the z-axis direction by applying a voltage between the electrodes.

Figure 34:
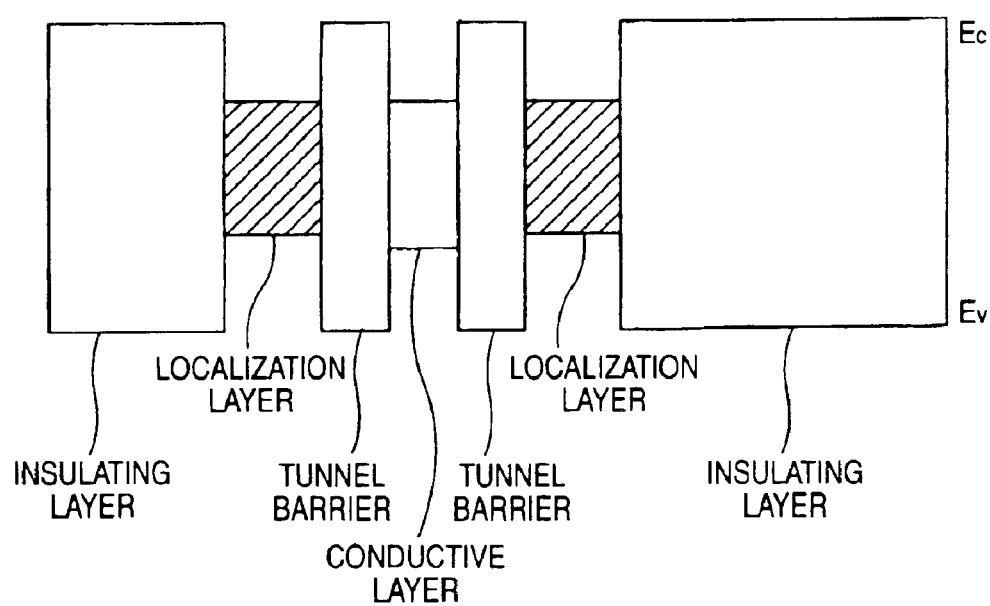
FIG. 34 is a diagram showing an energy band of the electron device which controls quantum chaos shown in FIG. 33.

Shown in FIG. 34 is an energy band perpendicular to a hetero surface of the electron device which controls quantum chaos.

As described in the foregoing, according to the fifth embodiment, a double heterojunction is formed by bonding regions each having the electron system characterized by integrability with each sides of the region having the electron system characterized by quantum chaos, and the electric field perpendicular to the junction surfaces is applied to the double heterojunction to externally and more extensively control the quantum chaos property of the electron system of the system formed of the regions in such simple manner. Further, it is possible to form the heterojunction simply by using a single material.

Sixth Embodiment:

In the sixth embodiment, an example of an electron device which controls quantum chaos which is manufactured by using a Ge material and has a stacked structure shown in FIG. 31 as well as a manufacturing method thereof will be described.

In this electron device which controls quantum chaos, an insulating layer 41 formed from undoped $Si_xGe_{1-x}$ (0<x<1) or the like, a conductive layer 42 formed from undoped $Si_yGe_{1-y}$ (0≦y<1) or the like, a tunnel barrier 43 formed from undoped $Si_zGe_{1-z}$ (y<z<1) or the like, a localization layer 44 formed from Ge which is doped with impurity such as As, a tunnel barrier 45 formed from undoped $Si_zGe_{1-z}$ (y <z <1) or the like, a conductive layer 46 formed from undoped $Si_yGe_{1-y}$(0<y<1) or the like, and an insulating layer 47 formed from undoped $Si_xGe_{1-x}$ (0<x<1) or the like are stacked in this order in the lattice matching state to form a heterojunction of SiGe/SiGe/SiGe/Ge/SiGe/SiGe/SiGe (in the order of from bottom to top). A random potential is introduced by adding As as impurity to Ge in the localization layer 44, and the random potential is not introduced to other layers or, if introduced, the quantity is ignorable. The localization layer 44 shows the Anderson localization, and the conductive layers 42 and 46 show the metallic state.

Hereinafter, the method of manufacturing the electron device which controls quantum chaos by employing the neutron transition doping (NTD) (Non-Patent Literature 16) will be described.

The NTD will be described in terms of Ge. Stable isotopes are present in Ge, and abundance ratios of the isotopes are as follows: about 20% of $^{70}Ge$; about 27% of $^{72}Ge$; about 8% of $^{73}Ge$; about 37% of $^{74}Ge$; and about 8% of $^{76}Ge$. Among the isotopes, $^{70}Ge$, for example, causes a nuclear reaction due to a collision of neutrons to change into a stable nuclear $^{71}Ge$ by absorbing electrons. Also, $^{74}Ge$ causes a nuclear reaction with neutrons, and the nuclear reaction associates a β decay so that the $^{74}Ge$ is changed into $^{75}As$. Therefore, by exposing the Ge crystal containing the isotopes to neutrons, the nuclear reactions are caused to enable a conversion of the Ge atoms in the crystal into atoms having nuclear such as $^{71}Ge$ and $^{75}As$. According to this method, it is possible to perform a doping using the atoms without converting the atoms positioned on the lattice points of the crystal lattice. It is known that this method enables a remarkably uniform doping.

In the manufacture of the electron device which controls quantum chaos, an undoped $Si_x{}^{72}Ge_{1-x}$ layer as the insulating layer 41, an undoped $Si_y{}^{72}Ge_{1-y}$ layer as the conductive layer 42, an undoped $Si_z{}^{72}Ge_{1-z}$ layer as the tunnel barrier layer 43, an undoped $^{74}Ge$ layer as the localization layer 44, an undoped $Si_z{}^{72}Ge_{1-z}$ layer as the tunnel barrier layer 45, an undoped $Si_y{}^{72}Ge_{1-y}$ layer as the conductive layer 46, and an undoped $Si_z{}^{72}Ge_{1-z}$ layer as the insulating layer 47 are stacked in this order on a predetermined substrate (not shown) by the epitaxial growth.

Then, the thus-obtained stacked structure is irradiated with a monochromatic neutron beam having neutron energies which are uniform in volume. As a result of the irradiation, $^{74}Ge$ which is a part of the undoped $^{74}Ge$ layer irradiated with the neutrons causes a nuclear reaction thanks to the neutron collision to convert into $^{75}As$. Since the probability of the nuclear reaction is in proportion to intensity of the incident neutron beam, $^{75}As$ is generated at a concentration proportional to the incident neutron beam intensity. Since $^{75}As$ acts as n type impurity on the $^{74}Ge$ layer, the $^{74}Ge$ layer is doped with the n-type impurity $^{75}As$ as a result of the neutron irradiation. By adjusting the incident neutron beam intensity or the like, it is possible to control a concentration of $^{75}As$, i.e. a doping concentration, to achieve a desired concentration. Since $Si^{72}Ge$ does not cause the nuclear reaction with the neutron beam irradiation, only the $^{74}Ge$ layer is doped with $^{75}As$.

Thus, the desired Ge-based electron device which controls quantum chaos is obtained.

According to the sixth embodiment, the following advantages are achieved in addition to the advantages achieved by the fifth embodiment. That is, since the NTD is employed for forming the localization layer 44 which is formed from Ge doped with As, no crystal defect is generated during the doping in principle and the crystallinity of the localization layer 44 is not damaged unlike the case with a doping by the thermal diffusion or the ion implantation, thereby making it possible to obtain an electron device which controls quantum chaos of excellent properties.

Though the specific descriptions of the embodiments of the invention are given in the foregoing, the invention is not limited by the foregoing embodiments, and various modification are easily accomplished based on the technical scope of the invention.

For instance, the values, structures, shapes, and materials used in the foregoing embodiments are given only by way of example, and it is possible to use different values, structures, shapes, and materials if necessary.

Further, it is needless to say that the NTD method employed in the sixth embodiment is applicable not only to the double heterojunction formation but also to a single heterojunction formation.

Also, it is possible to perform a modulation doping by applying the NTD method to the tunnel barriers 43 and 45 in the sixth embodiment. More specifically, the modulation doping of the n-type impurity is performed by forming undoped $Si_z{}^{74}Ge_{1-z}$ layers as the tunnel barriers 43 and 45 in place of the undoped $Si_z{}^{72}Ge_{1-z}$ layers and then irradiating the undoped $Si_z{}^{74}Ge_{1-z}$ layers with the monochromatic neutron beam to convert $^{74}Ge$ which is a part of the layers into $^{75}As$.

What is claimed is:

1. An electron device which controls quantum chaos comprising a heterojunction which is provided with:

a first region having an electron system characterized by quantum chaos with the first region in a metallic state, and a second region having an electron system characterized by integrability and having a random magnetic field, wherein, the first region and the second region are adjacent to each other, the heterojunction is capable of exchanging electrons between the first region and the second region, and a quantum chaos property of the electron device is controllable by applying to the heterojunction an electric field having a component perpendicular to at least a junction surface and an electrode for applying the electric field to the heterojunction.

2. The electron device which controls quantum chaos according to claim 1, wherein the second region includes a magnetic impurity.

* * * * *